US012606929B2

(12) United States Patent
Tsuji et al.

(10) Patent No.: US 12,606,929 B2
(45) Date of Patent: Apr. 21, 2026

(54) PLATING APPARATUS AND SUBSTRATE CLEANING METHOD

(71) Applicant: EBARA CORPORATION, Tokyo (JP)

(72) Inventors: Kazuhito Tsuji, Tokyo (JP); Kentaro Yamamoto, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 462 days.

(21) Appl. No.: 17/923,558

(22) PCT Filed: Nov. 4, 2021

(86) PCT No.: PCT/JP2021/040600
§ 371 (c)(1),
(2) Date: Nov. 4, 2022

(87) PCT Pub. No.: WO2023/079632
PCT Pub. Date: May 11, 2023

(65) Prior Publication Data
US 2025/0075363 A1     Mar. 6, 2025

(51) Int. Cl.
*C25D 17/06* (2006.01)
*B05B 13/02* (2006.01)
(Continued)

(52) U.S. Cl.
CPC .......... *C25D 17/06* (2013.01); *B05B 13/0221* (2013.01); *B08B 3/022* (2013.01);
(Continued)

(58) Field of Classification Search
CPC .......... C25D 17/06; C25D 7/12; C25D 17/00; C25D 21/08; C25D 21/10; C25D 17/004;
(Continued)

(56) References Cited

U.S. PATENT DOCUMENTS

2002/0096436 A1* 7/2002 Olgado ................ C25D 17/004
                                                                204/279
2003/0094372 A1* 5/2003 Okase .................... C25D 21/04
                                                                205/94
(Continued)

FOREIGN PATENT DOCUMENTS

CN          1463018 A  * 12/2003
CN          1508296 A     6/2004
(Continued)

OTHER PUBLICATIONS

KR101102328 translation (Year: 2012).*
(Continued)

*Primary Examiner* — Michael E Barr
*Assistant Examiner* — Lauren G Orta
(74) *Attorney, Agent, or Firm* — BakerHostetler

(57)                    ABSTRACT

A substrate is efficiently cleaned.
A plating module 400 includes: a plating tank 410 configured to accommodate a plating solution; a substrate holder 440 configured to hold a substrate Wf with a surface to be plated Wf-a facing downward; a rotation mechanism 446 configured to rotate the substrate holder 440; an inclination mechanism 447 configured to incline the substrate holder 440; and a substrate cleaning member 472 for cleaning the surface to be plated Wf-a of the substrate Wf held by the substrate holder 440. The substrate cleaning member 472 is configured to discharge a cleaning liquid to the surface to be plated Wf-a of the substrate Wf rotated by the rotation mechanism 446 from a position corresponding to a lower end toward a position corresponding to an upper end of the substrate Wf inclined by the inclination mechanism 447.

7 Claims, 23 Drawing Sheets

<u>400</u>

(51) Int. Cl.

| | |
|---|---|
| *B08B 3/02* | (2006.01) |
| *B08B 13/00* | (2006.01) |
| *C23C 18/16* | (2006.01) |
| *C25D 7/12* | (2006.01) |
| *C25D 17/00* | (2006.01) |
| *C25D 21/08* | (2006.01) |
| *C25D 21/10* | (2006.01) |
| *C25D 21/12* | (2006.01) |
| *H01L 21/02* | (2006.01) |

(52) U.S. Cl.
CPC .......... *B08B 13/00* (2013.01); *C23C 18/1669*
(2013.01); *C25D 7/12* (2013.01); *C25D 17/00*
(2013.01); *C25D 17/001* (2013.01); *C25D*
*17/004* (2013.01); *C25D 21/08* (2013.01);
*C25D 21/10* (2013.01); *C25D 21/12*
(2013.01); *H01L 21/02068* (2013.01)

(58) Field of Classification Search
CPC ... C25D 17/001; B05B 13/0221; B08B 3/022;
B08B 13/00; H01L 21/02068
See application file for complete search history.

(56) References Cited

U.S. PATENT DOCUMENTS

| | | | |
|---|---|---|---|
| 2004/0118676 A1 | 6/2004 | Mizohata et al. | |
| 2004/0140199 A1* | 7/2004 | Mizohata ............. C25D 17/001 |
| | | | 257/E21.175 |

FOREIGN PATENT DOCUMENTS

| | | | | | |
|---|---|---|---|---|---|
| CN | 112509945 A | * | 3/2021 | ....... H01L 21/67051 |
| JP | H06-071544 B2 | | 9/1994 | |
| JP | 2005-264245 A | | 3/2005 | |
| JP | 2011-089209 A | | 5/2011 | |
| JP | 5815827 B2 | * | 11/2015 | |
| JP | 6934127 B1 | | 9/2021 | |
| KR | 20070064847 A | * | 6/2007 | .......... C25D 17/001 |
| KR | 101102328 B1 | * | 1/2012 | ............. C25D 17/04 |
| WO | WO-2011148827 A1 | * | 12/2011 | ............. B08B 3/022 |
| WO | WO 2022/137339 A1 | | 6/2022 | |

OTHER PUBLICATIONS

KR20070064847 translation (Year: 2007).*
WO2011148827 translation (Year: 2011).*
JP5815827 translation (Year: 2015).*
CN112509945 translation (Year: 2021).*
CN1463018 translation (Year: 2003).*

* cited by examiner

Fig. 10

PLATING APPARATUS AND SUBSTRATE CLEANING METHOD

TECHNICAL FIELD

This application relates to a plating apparatus and a substrate cleaning method.

BACKGROUND ART

There has been known a cup type electroplating apparatus as one example of a plating apparatus. The cup type electroplating apparatus deposits a conductive film on a surface of a substrate (for example, a semiconductor wafer) by immersing the substrate held by a substrate holder with a surface to be plated facing downward in a plating solution and applying a voltage between the substrate and an anode.

For example, in PTL 1, a cleaning device for cleaning the substrate after plating process is disclosed. This cleaning device is configured to wash away a plating solution and the like adhered to a surface to be plated of a substrate by discharging a cleaning liquid upward toward the surface to be plated while rotating the substrate from a plurality of cleaning nozzles disposed in a lower side of the substrate along a radial direction of the substrate.

CITATION LIST

Patent Literature

PTL 1: Japanese Patent No. 6934127

SUMMARY OF INVENTION

Technical Problem

In the plating apparatus of the prior art, there is a room for improvement in efficient cleaning of the substrate.

That is, in the prior art, when a cleaning liquid collides against a surface to be plated, a plating solution adhered to the surface to be plated is washed away by the cleaning liquid, and a part of it drops and is recovered, meanwhile, the other part partially moves to a downstream side of a cleaning region in association with a rotation of the substrate while remaining to be adhered to the surface to be plated of a substrate. Since the plating solution moved to the downstream side of the cleaning region is not washed away until it moves to the cleaning region again by 360° turn of the substrate, the time period of the cleaning process increases for sufficiently cleaning the whole surface to be plated.

Therefore, it is an object of this application to efficiently clean a substrate.

Solution to Problem

According to one embodiment, a plating apparatus is disclosed. The plating apparatus includes: a plating tank configured to accommodate a plating solution; a substrate holder configured to hold a substrate with a surface to be plated facing downward; a rotation mechanism configured to rotate the substrate holder; an inclination mechanism configured to incline the substrate holder; and a substrate cleaning member for cleaning the surface to be plated of the substrate held by the substrate holder. The substrate cleaning member is configured to discharge a cleaning liquid to the surface to be plated of the substrate rotated by the rotation mechanism from a position corresponding to a lower end toward a position corresponding to an upper end of the substrate inclined by the inclination mechanism.

BRIEF DESCRIPTION OF DRAWINGS

FIG. 10 is a vertical cross-sectional view schematically illustrating the configuration of the plating module of this embodiment.

DESCRIPTION OF EMBODIMENTS

Figure 1:
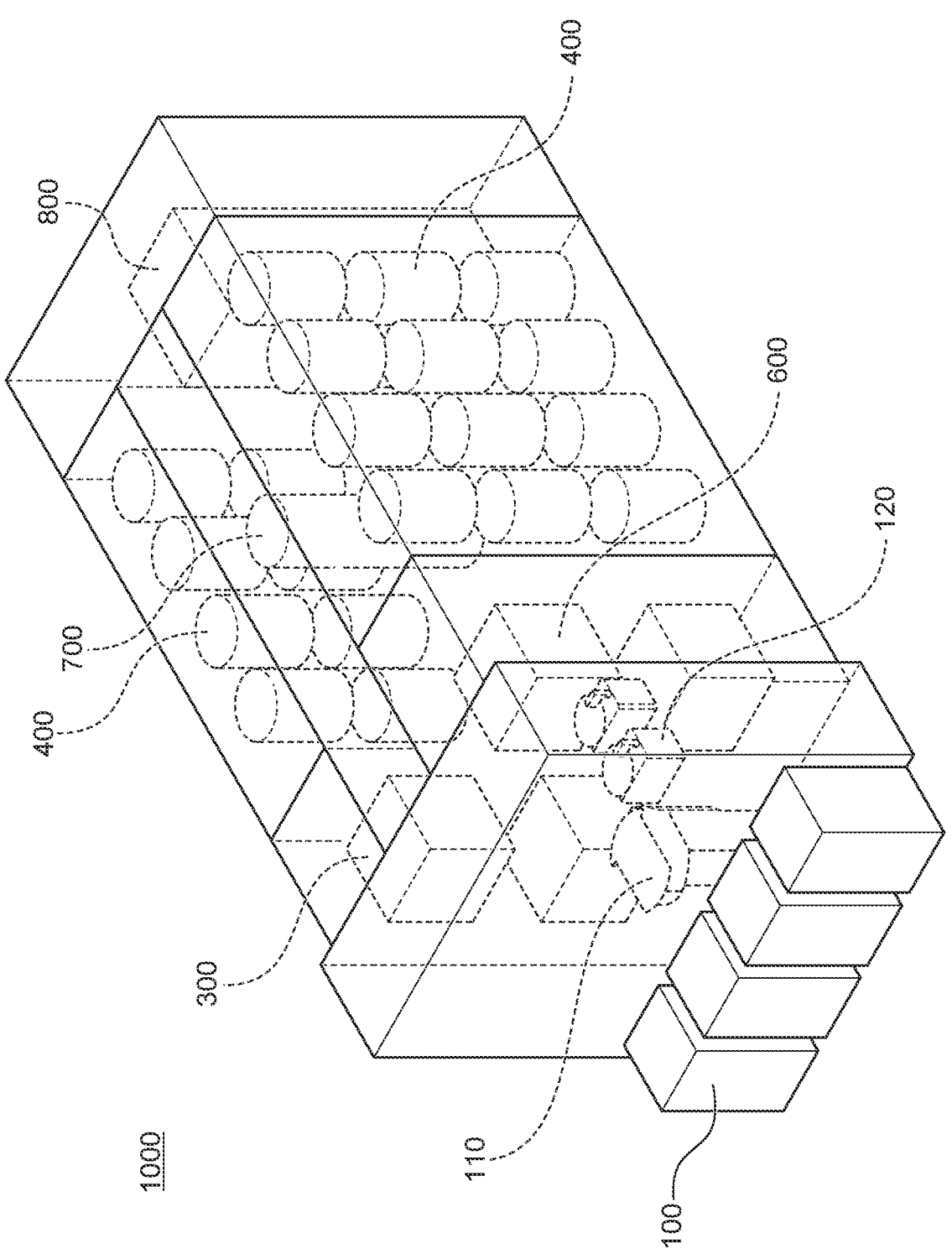
FIG. 1 is a perspective view illustrating an overall configuration of a plating apparatus of this embodiment.

The following describes embodiments of the present invention with reference to the drawings. In the drawings described below, identical reference numerals are attached to identical or equivalent components, and overlapping description is omitted.

<Overall Configuration of Plating Apparatus>

Figure 2:
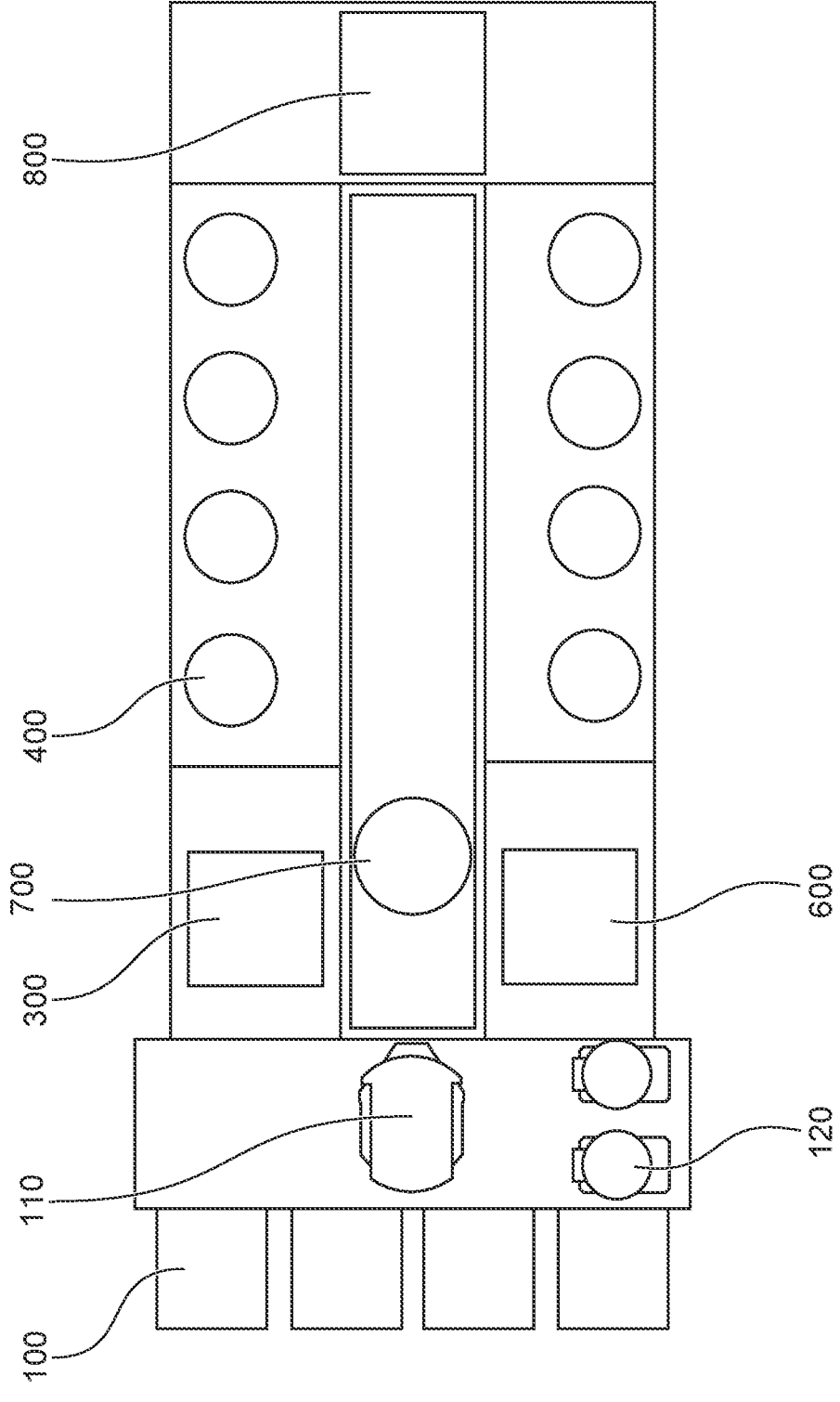
FIG. 2 is a plan view illustrating the overall configuration of the plating apparatus of this embodiment.

FIG. 1 is a perspective view illustrating the overall configuration of the plating apparatus of this embodiment. FIG. 2 is a plan view illustrating the overall configuration of the plating apparatus of this embodiment. As illustrated in FIGS. 1 and 2, a plating apparatus 1000 includes load ports 100, a transfer robot 110, aligners 120, pre-soak modules 300, plating modules 400, spin rinse dryers 600, a transfer device 700, and a control module 800.

The load port 100 is a module for loading a substrate housed in a cassette, such as a FOUP, (not illustrated) to the plating apparatus 1000 and unloading the substrate from the plating apparatus 1000 to the cassette. While the four load ports 100 are arranged in the horizontal direction in this embodiment, the number of load ports 100 and arrangement of the load ports 100 are arbitrary. The transfer robot 110 is a robot for transferring the substrate that is configured to grip or release the substrate between the load port 100, the aligner 120, and the spin rinse dryer 600. The transfer robot 110 and the transfer device 700 can perform delivery and receipt of the substrate via a temporary placement table (not illustrated) to grip or release the substrate between transfer robot 110 and the transfer device 700.

The aligner 120 is a module for adjusting a position of an orientation flat, a notch, and the like of the substrate in a predetermined direction. While the two aligners 120 are disposed to be arranged in the horizontal direction in this embodiment, the number of aligners 120 and arrangement of the aligners 120 are arbitrary.

For example, the pre-soak module 300 is configured to remove an oxidized film having a large electrical resistance present on a surface of a seed layer formed on the surface to be plated of the substrate before the plating process by etching with a process liquid, such as sulfuric acid and hydrochloric acid, and perform a pre-soak process that cleans or activates a surface of a plating base layer. While the two pre-soak modules 300 are disposed to be arranged in the vertical direction in this embodiment, the number of pre-soak modules 300 and arrangement of the pre-soak modules 300 are arbitrary. The plating module 400 performs the plating process on the substrate. There are two sets of the 12 plating modules 400 arranged by three in the vertical direction and by four in the horizontal direction, and the total 24 plating modules 400 are disposed in this embodiment, but the number of plating modules 400 and arrangement of the plating modules 400 are arbitrary.

The spin rinse dryer 600 is a module for rotating the substrate after the cleaning process at high speed and drying the substrate. While the two spin rinse dryers are disposed to be arranged in the vertical direction in this embodiment, the number of spin rinse dryers and arrangement of the spin rinse dryers are arbitrary. The transfer device 700 is a device for transferring the substrate between the plurality of modules inside the plating apparatus 1000. The control module 800 is configured to control the plurality of modules in the plating apparatus 1000 and can be configured of, for example, a general computer including input/output interfaces with an operator or a dedicated computer.

An example of a sequence of the plating processes by the plating apparatus 1000 will be described. First, the substrate housed in the cassette is loaded on the load port 100. Subsequently, the transfer robot 110 grips the substrate from the cassette at the load port 100 and transfers the substrate to the aligners 120. The aligner 120 adjusts the position of the orientation flat, the notch, or the like of the substrate in the predetermined direction. The transfer robot 110 grips or releases the substrate whose direction is adjusted with the aligners 120 to the transfer device 700.

The transfer device 700 transfers the substrate received from the transfer robot 110 to the plating module 400. The plating module 400 performs the pre-wet process on the substrate. The transfer device 700 transfers the substrate on which the pre-wet process has been performed to the pre-soak module 300. The pre-soak module 300 performs the pre-soak process on the substrate. The transfer device 700 transfers the substrate on which the pre-soak process has been performed to the plating module 400. The plating module 400 performs the plating process on the substrate. Furthermore, the plating module 400 performs the cleaning process on the substrate on which the plating process has been performed.

The transfer device 700 transfers the substrate on which the cleaning process has been performed to the spin rinse dryer 600. The spin rinse dryer 600 performs the drying process on the substrate. The transfer robot 110 receives the substrate from the spin rinse dryer 600 and transfers the substrate on which the drying process has been performed to the cassette at the load port 100. Finally, the cassette housing the substrate is unloaded from the load port 100.

<Configuration of Plating Module>

Figure 3:
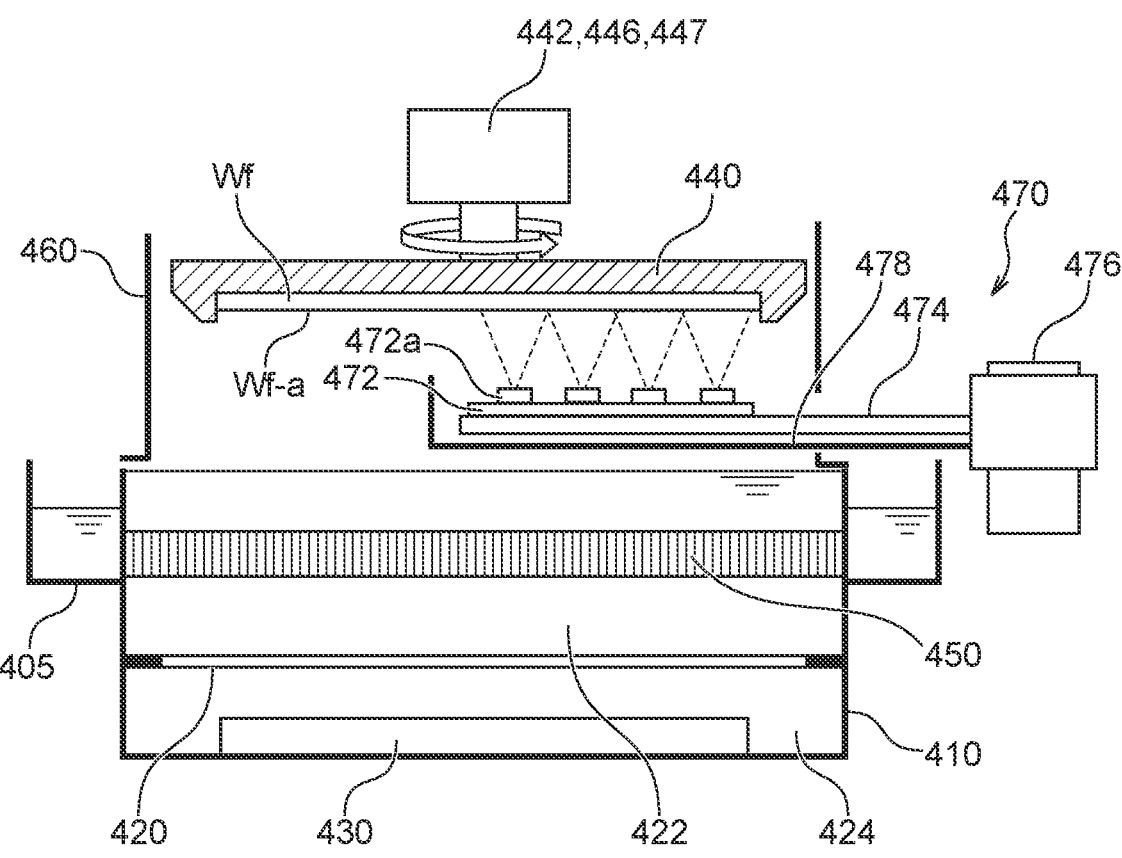
FIG. 3 is a vertical cross-sectional view schematically illustrating a configuration of a plating module of this embodiment.

Next, the configuration of the plating modules 400 will be described. Since the 24 plating modules 400 in this embodiment have the identical configuration, only one of the plating modules 400 will be described. FIG. 3 is a vertical cross-sectional view schematically illustrating the configuration of the plating module 400 of this embodiment. As illustrated in FIG. 3, the plating module 400 includes a plating tank 410 for accommodating a plating solution. The plating tank 410 is a container having a cylindrical side wall and a circular-shaped bottom wall and has a circular-shaped opening formed on an upper portion. Further, the plating module 400 includes an overflow tank 405 arranged on an outer side of the upper opening of the plating tank 410. The overflow tank 405 is a container for receiving the plating solution overflowing from the upper opening of the plating tank 410.

The plating module 400 includes a membrane 420 that separates an inside of the plating tank 410 in the vertical direction. The inside of the plating tank 410 is divided into a cathode region 422 and an anode region 424 by the membrane 420. The cathode region 422 and the anode region 424 are each filled with the plating solution. An anode 430 is disposed on the bottom surface of the plating tank 410 in the anode region 424. In the cathode region 422, an ionically resistive element 450 is arranged to be opposed to the membrane 420. The ionically resistive element 450 is a member for intending homogenization of the plating process on a surface to be plated Wf-a of a substrate Wf and is configured of a plate-shaped member in which multiple holes are formed.

The plating module 400 includes a substrate holder 440 for holding the substrate Wf with the surface to be plated Wf-a facing downward. The plating module 400 includes an elevating mechanism 442 for elevating the substrate holder 440. For example, the elevating mechanism 442 can be achieved by a known mechanism, such as a motor. Further, the plating module 400 includes a rotation mechanism 446 for rotating the substrate holder 440 so that the substrate Wf rotates around a virtual rotation axis perpendicularly extending the center of the surface to be plated Wf-a. For example, the rotation mechanism 446 can be achieved by a known mechanism, such as a motor.

The plating module 400 is configured to perform the plating process on the surface to be plated Wf-a of the substrate Wf by immersing the substrate Wf in the plating solution in the cathode region 422 using the elevating mechanism 442 and applying a voltage between the anode 430 and the substrate Wf while rotating the substrate Wf using the rotation mechanism 446.

Further, the plating module 400 includes an inclination mechanism 447 configured to incline the substrate holder 440. For example, the inclination mechanism 447 can be achieved by a known mechanism, such as a tilt mechanism.

The plating module 400 includes a cover member 460 arranged above the plating tank 410 and a cleaning device 470 for performing the cleaning process of the substrate Wf held by the substrate holder 440. The following describes the cover member 460 and the cleaning device 470.

<Cover Member>

Figure 4:
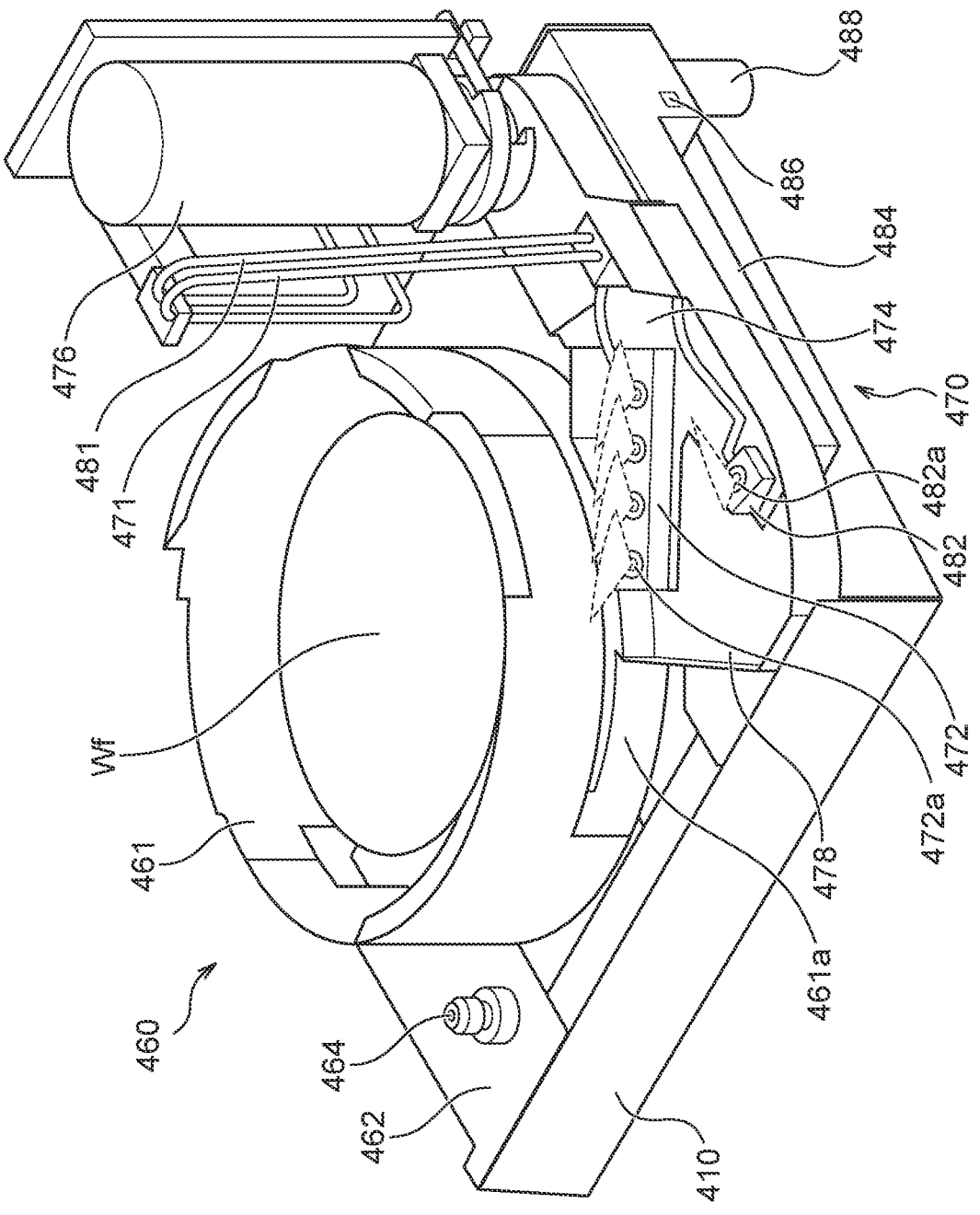
FIG. 4 is a perspective view schematically illustrating the configuration of the plating module of this embodiment.
Figure 5A:
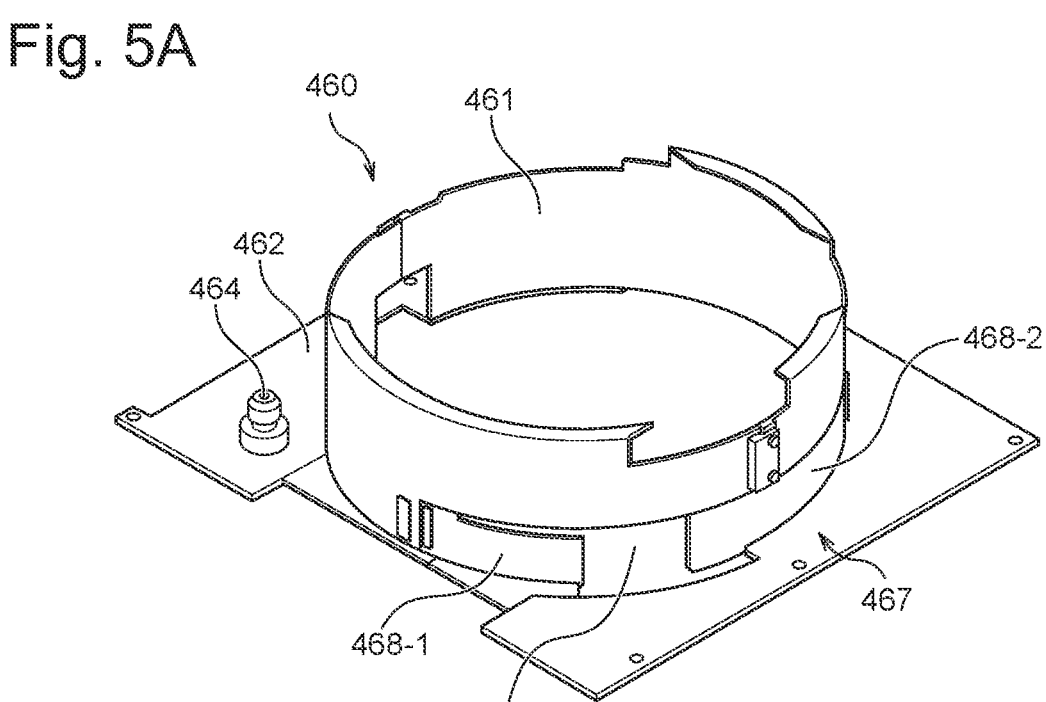
FIG. 5A is a perspective view schematically illustrating a cover member of the plating module of this embodiment.
Figure 5B:
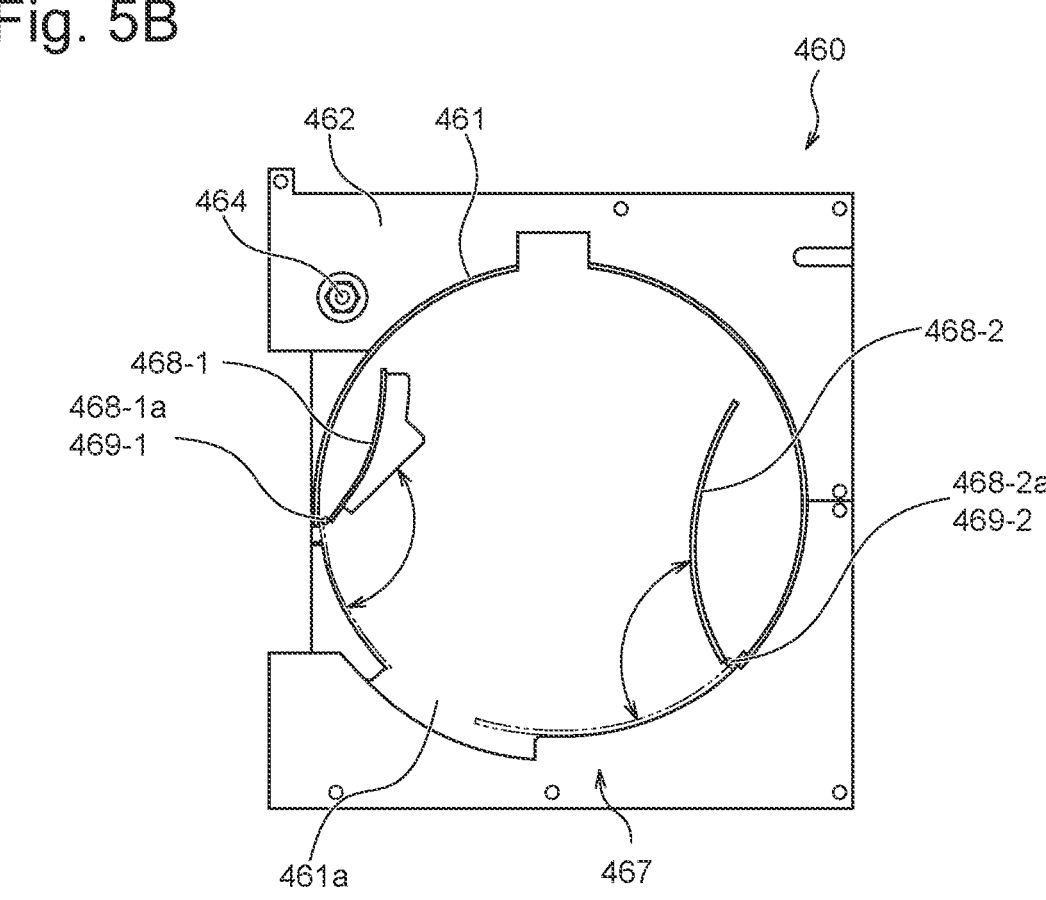
FIG. 5B is a plan view schematically illustrating the cover member of the plating module of this embodiment.
Figure 6:
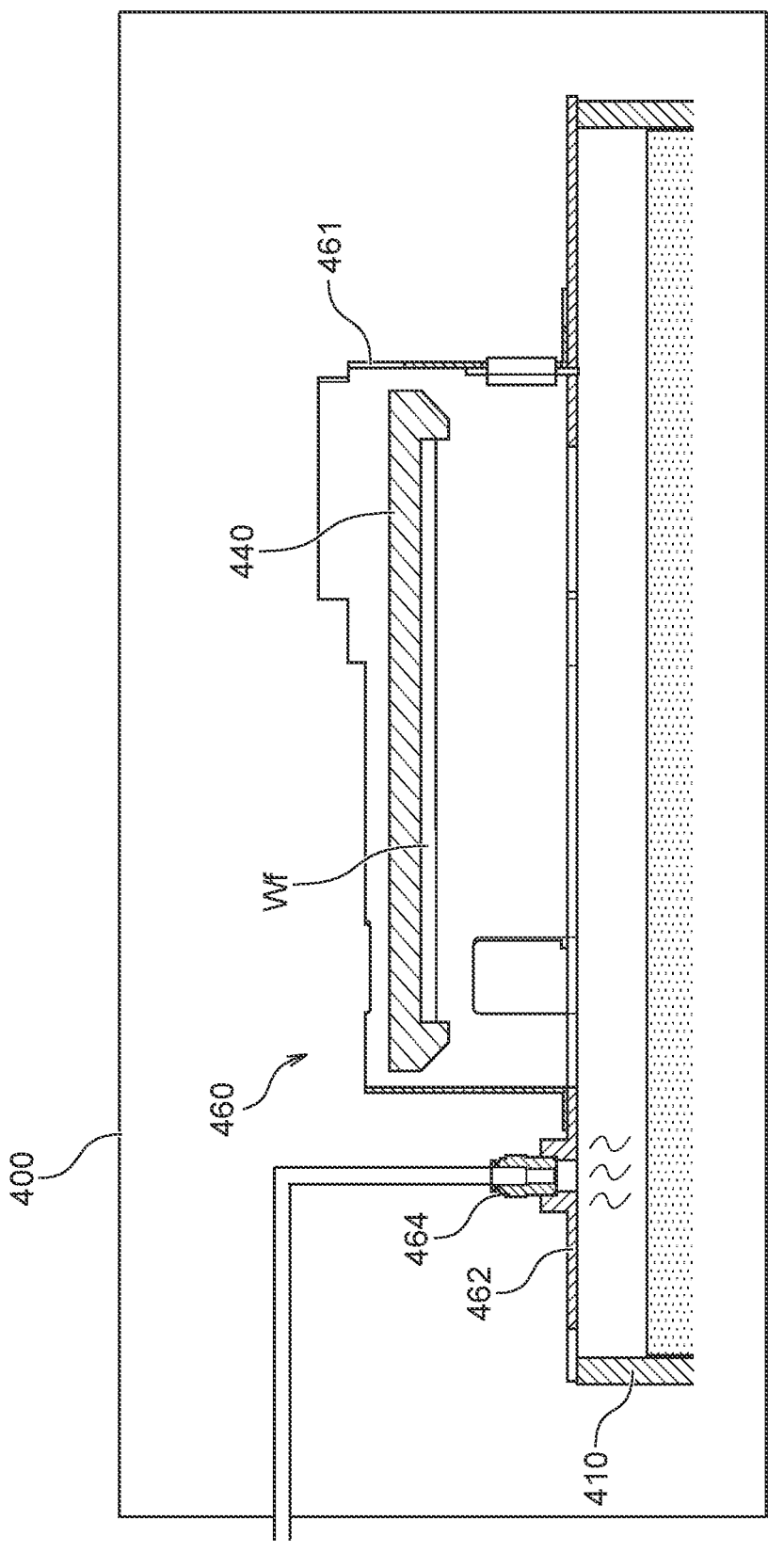
FIG. 6 is a vertical cross-sectional view schematically illustrating the cover member of the plating module of this embodiment.

FIG. 4 is a perspective view schematically illustrating the configuration of the plating module of this embodiment. FIG. 5A is a perspective view schematically illustrating a cover member of the plating module of this embodiment. FIG. 5B is a plan view schematically illustrating the cover member of the plating module of this embodiment. FIG. 6 is a vertical cross-sectional view schematically illustrating the cover member of the plating module of this embodiment.

As illustrated in FIG. 4 to FIG. 6, the cover member 460 has a cylindrical side wall 461 arranged above the plating tank 410. The side wall 461 is arranged to surround an elevating path of the substrate holder 440. Further, the cover member 460 has a bottom wall 462 connected to the lower end of the side wall 461. The bottom wall 462 is a plate-shaped member that covers an outer side of the upper opening of the plating tank 410 with respect to the side wall 461.

As illustrated in FIG. 4 to FIG. 6, an exhaust outlet 464 is formed in the bottom wall 462. As illustrated in FIG. 6, the exhaust outlet 464 is communicated with an outside of a space in the plating module 400 in which members, such as the plating tank 410, the substrate holder 440, and the cover member 460, are installed. Therefore, an atmosphere generated by causing the plating solution in the plating tank 410 to turn to mist (plating solution atmosphere) is discharged to the outside of the plating module 400 via the exhaust outlet 464. While the example in which the exhaust outlet 464 is formed in the bottom wall 462 has been illustrated in this embodiment, the present invention is not limited to this, and the exhaust outlet 464 may be formed in at least one of the side wall 461 and the bottom wall 462.

As illustrated in FIG. 5A and FIG. 5B, an opening 461a is formed in the side wall 461 of the cover member 460. This opening 461a becomes a passage for moving the cleaning device 470 between an outside and an inside of the side wall 461. The plating module 400 includes an opening/closing mechanism 467 configured to open and close the opening 461a.

The opening/closing mechanism 467 includes a first door 468-1 and a second door 468-2 for opening and closing the opening 461a. The first door 468-1 and the second door 468-2 are disposed to be arranged along the circumferential direction of the side wall 461. The first door 468-1 is rotatably supported by a rotation shaft 468-1a disposed on one side end portion of the opening 461a. The second door 468-2 is rotatably supported by a rotation shaft 468-2a disposed on the other side end portion of the opening 461a.

The opening/closing mechanism 467 includes a first door driving member 469-1 for rotationally moving the first door 468-1 toward an inside of the cover member 460 and a second door driving member 469-2 for rotationally moving the second door 468-2 toward the inside of the cover member 460. For example, the first door driving member 469-1 and the second door driving member 469-2 can be achieved by a known mechanism, such as a motor.

With this embodiment, both execution of cleaning of the substrate Wf and suppression of the plating solution atmosphere inside the plating tank 410 being emitted into the plating module 400 can be achieved. That is, since the upper opening of the plating tank 410 is covered with the bottom wall 462, the side wall 461, and the substrate holder 440 by providing the cover member 460, emission of the plating solution atmosphere inside the plating tank 410 from the upper opening of the plating tank 410 is suppressed. Since the exhaust outlet 464 is formed in the bottom wall 462, the plating solution atmosphere inside the plating tank 410 is discharged to the outside of the plating module 400 via the exhaust outlet 464. This can suppress generation of rust or corrosion on various components, wiring, and the like arranged in the plating module 400.

In addition to this, the opening 461a is formed in the side wall 461, and the opening 461a can be opened and closed by the first door 468-1 and the second door 468-2. Therefore, when the cleaning process of the substrate Wf is not performed, the first door driving member 469-1 and the second door driving member 469-2 can suppress emission of the plating solution atmosphere by closing the opening 461a. On the other hand, when the cleaning process of the substrate Wf is performed, the first door driving member 469-1 and the second door driving member 469-2 can move the cleaning device 470 to the inside of the cover member 460 by opening the opening 461a, and accordingly, the cleaning process can be executed. Details of the cleaning process using the cleaning device 470 will be described below.

Figure 7A:
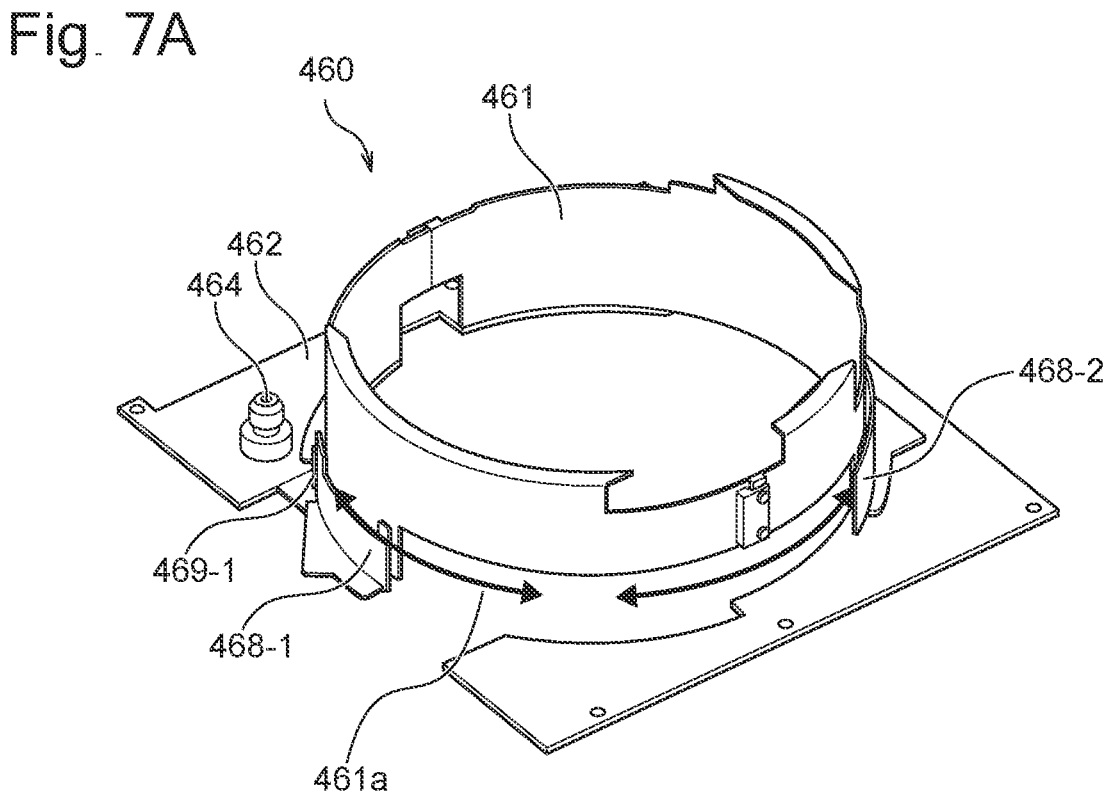
FIG. 7A is a perspective view schematically illustrating a cover member of a modification.
Figure 7B:
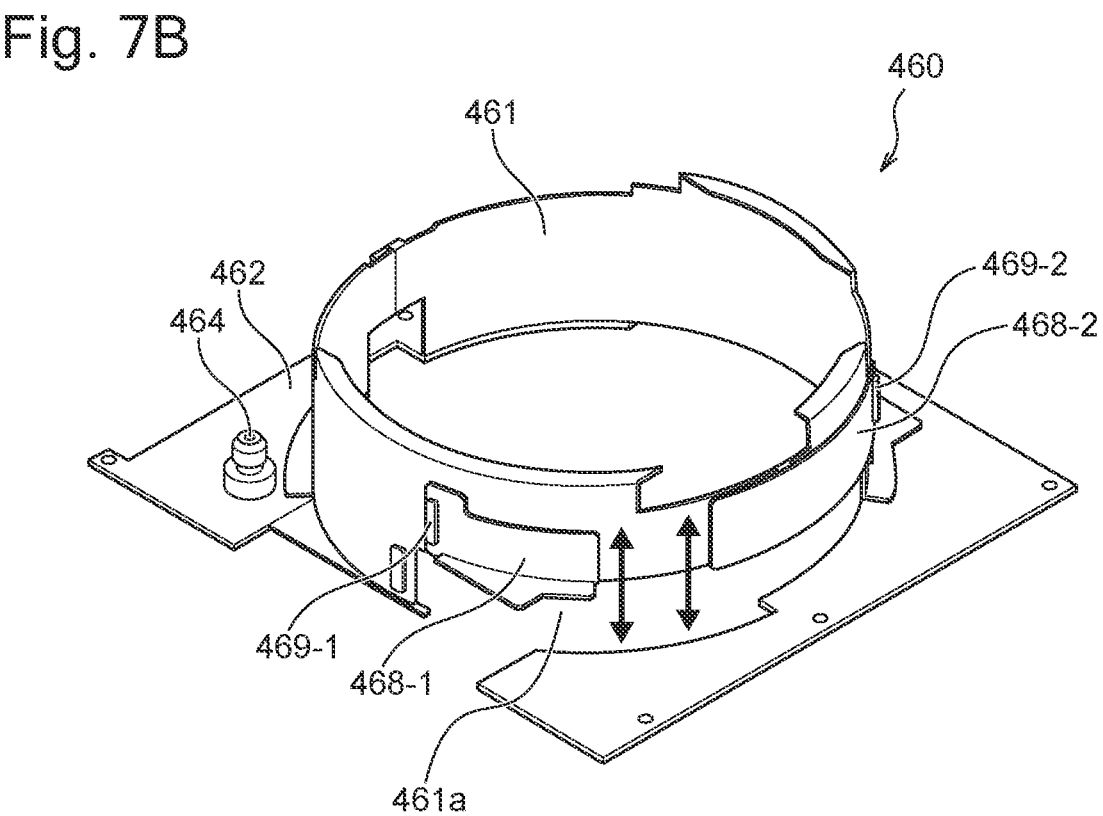
FIG. 7B is a perspective view schematically illustrating a cover member of a modification.

In the above-described embodiment, while the example in which the first door 468-1 and the second door 468-2 are rotationally moved toward the inside of the cover member 460 has been illustrated, the present invention is not limited to this. FIG. 7A and FIG. 7B are perspective views schematically illustrating cover members of modifications. FIG. 7A and FIG. 7B illustrate a state where the first door 468-1 and the second door 468-2 open the opening 461a.

As illustrated in FIG. 7A, the first door 468-1 and the second door 468-2 may be attached to the side wall 461 so as to be movable along the circumferential direction of the side wall 461. The first door driving member 469-1 may be configured to slidingly move the first door 468-1 along the circumferential direction of the side wall 461 of the cover member 460. The second door driving member 469-2 may be configured to slidingly move the second door 468-2 along the circumferential direction of the side wall 461 of the cover member 460.

As illustrated in FIG. 7B, the first door 468-1 and the second door 468-2 may be attached to the side wall 461 so as to be movable in the vertical direction along the side wall 461. The first door driving member 469-1 may be configured to slidingly move the first door 468-1 in the vertical direction along the side wall 461 of the cover member 460. The second door driving member 469-2 may be configured to slidingly move the second door 468-2 in the vertical direction along the side wall 461 of the cover member 460.

<Cleaning Device>

Figure 8:
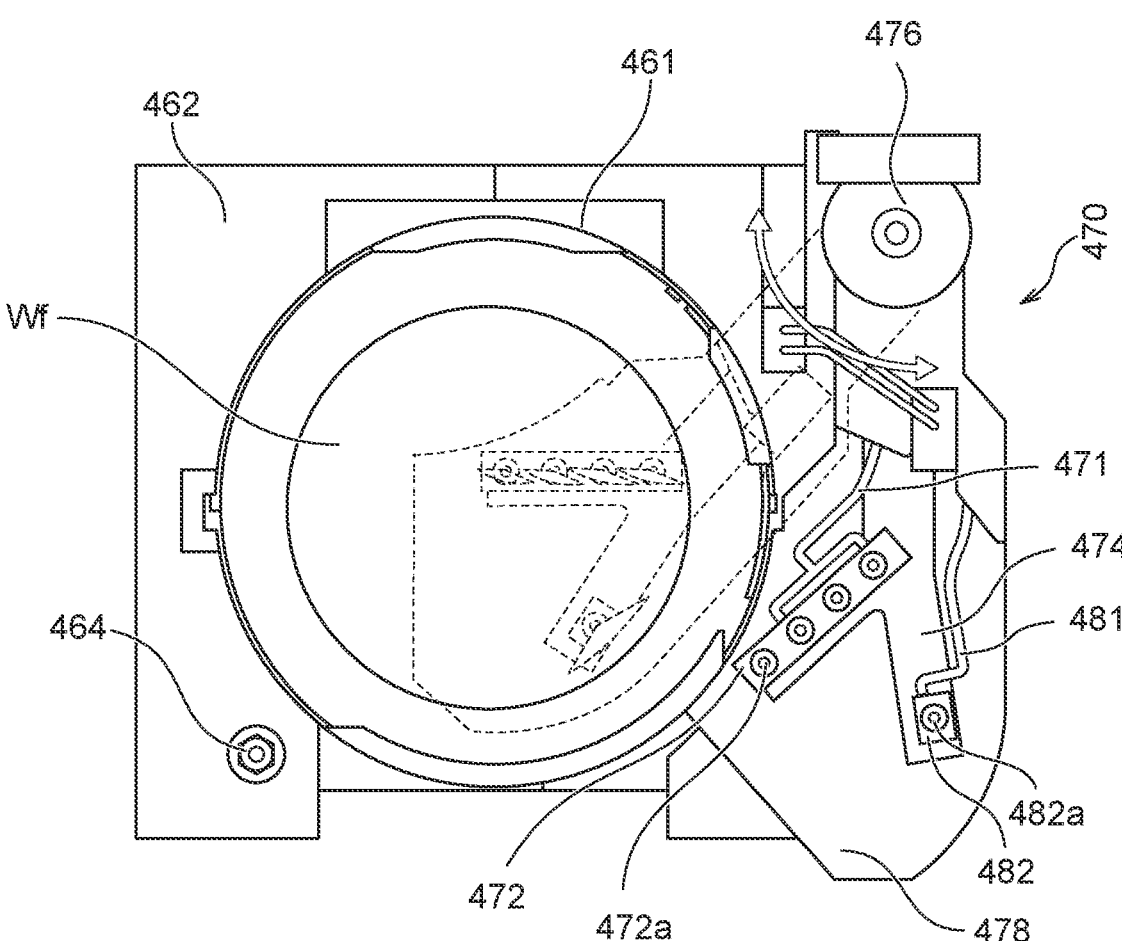
FIG. 8 is a plan view schematically illustrating the configuration of the plating module of this embodiment.

Next, the cleaning device 470 will be described. FIG. 8 is a plan view schematically illustrating the configuration of the plating module of this embodiment. As illustrated in FIG. 3, FIG. 4, and FIG. 8, the cleaning device 470 includes a substrate cleaning member 472 for cleaning the surface to be plated Wf-a of the substrate Wf held by the substrate holder 440. The substrate cleaning member 472 includes a plurality (four pieces, in this embodiment) of substrate cleaning nozzles 472a. The plurality of substrate cleaning nozzles 472a are arranged along the radial direction of the substrate Wf or a direction intersecting with the rotation direction of the substrate Wf when the substrate cleaning member 472 is arranged at a cleaning position. A pipe 471 is connected to the substrate cleaning member 472. A cleaning liquid (such as pure water) supplied from a liquid source (not illustrated) is sent to the substrate cleaning member 472 via the pipe 471 and discharged from each of the plurality of substrate cleaning nozzles 472a.

Further, the cleaning device 470 includes a contact cleaning member 482 for cleaning a contact member for feeding power to the substrate Wf held by the substrate holder 440. The contact cleaning member 482 includes a contact cleaning nozzle 482a for discharging the cleaning liquid. A pipe 481 is connected to the contact cleaning member 482. A cleaning liquid (such as pure water) supplied from a liquid source (not illustrated) is sent to the contact cleaning member 482 via the pipe 481 and discharged from the contact cleaning nozzle 482a. Details of cleaning of the contact member using the contact cleaning member 482 will be described below.

The cleaning device 470 includes a driving mechanism 476 configured to turn an arm 474. For example, the driving mechanism 476 can be achieved by a known mechanism, such as a motor. The arm 474 is a plate-shaped member extending in the horizontal direction from the driving mechanism 476. The substrate cleaning member 472 and the contact cleaning member 482 are held on the arm 474. The driving mechanism 476 is configured to move the substrate cleaning member 472 and the contact cleaning member 482 between the cleaning position between the plating tank 410 and the substrate holder 440 and a retracted position retracted from between the plating tank 410 and the substrate holder 440 by turning the arm 474. FIG. 8 illustrates a state where the substrate cleaning member 472 and the contact cleaning member 482 are arranged at the retracted position by a solid line and illustrates a state where the substrate cleaning member 472 and the contact cleaning member 482 are arranged at the cleaning position by a dashed line.

As illustrated in FIG. 4 and FIG. 8, the cleaning device 470 includes a tray member 478 arranged below the substrate cleaning member 472. The tray member 478 is a container configured to receive the cleaning liquid that has dropped after being discharged from the substrate cleaning member 472 and colliding with the surface to be plated Wf-a of the substrate Wf. Further, the tray member 478 is configured to receive the cleaning liquid that has dropped after being discharged from the contact cleaning member 482 and colliding with the contact member. In this embodiment, the whole of the substrate cleaning member 472, the contact cleaning member 482, and the arm 474 are accommodated in the tray member 478. The driving mechanism 476 is configured to turn the substrate cleaning member 472, the contact cleaning member 482, the arm 474, and the tray member 478 together between the cleaning position and the retracted position. However, the driving mechanism 476 may be configured to drive the substrate cleaning member 472, the contact cleaning member 482, and the arm 474 separately from the tray member 478.

As illustrated in FIG. 4, a fixed tray member 484 is arranged on a lower side of the tray member 478. The cleaning liquid that has dropped in the tray member 478 drops on the fixed tray member 484. A drain pipe 488 is attached to the fixed tray member 484. The cleaning liquid that has dropped in the fixed tray member 484 is discharged via the drain pipe 488.

The cleaning device 470 includes an electrical conductivity meter 486 for measuring an electrical conductivity of the cleaning liquid that has dropped in the tray member 478. Specifically, the electrical conductivity meter 486 is disposed at a position where the cleaning liquid in the fixed tray member 484 flows. The plating module 400 can obtain how much plating solution is included in the cleaning liquid, that is, to what extent the cleaning process has progressed, by measuring the electrical conductivity of the cleaning liquid in the fixed tray member 484. For example, the plating module 400 can make a determination on ending the cleaning process based on the electrical conductivity of the cleaning liquid measured by the electrical conductivity meter 486.

<Cleaning of Substrate>

When the plating process ends, the plating module 400 moves up the substrate holder 440 from the plating tank 410 by the elevating mechanism 442 and arranges the substrate holder 440 at a position surrounded by the cover member 460 (side wall 461). The plating module 400 arranges the substrate cleaning member 472 at the cleaning position as illustrated by the dashed line in FIG. 8. This causes the substrate cleaning nozzles 472a to be aimed toward the surface to be plated Wf-a of the substrate Wf. The plating module 400 rotates the substrate holder 440 by the rotation mechanism 446. For example, the rotation mechanism 446 is configured to rotate the substrate holder 440 at a rotation speed of 1 rpm to 20 rpm. Further, the plating module 400 cleans the surface to be plated Wf-a of the substrate Wf in a state where the substrate holder 440 is inclined by the inclination mechanism 447. The following describes this point.

Figure 9:
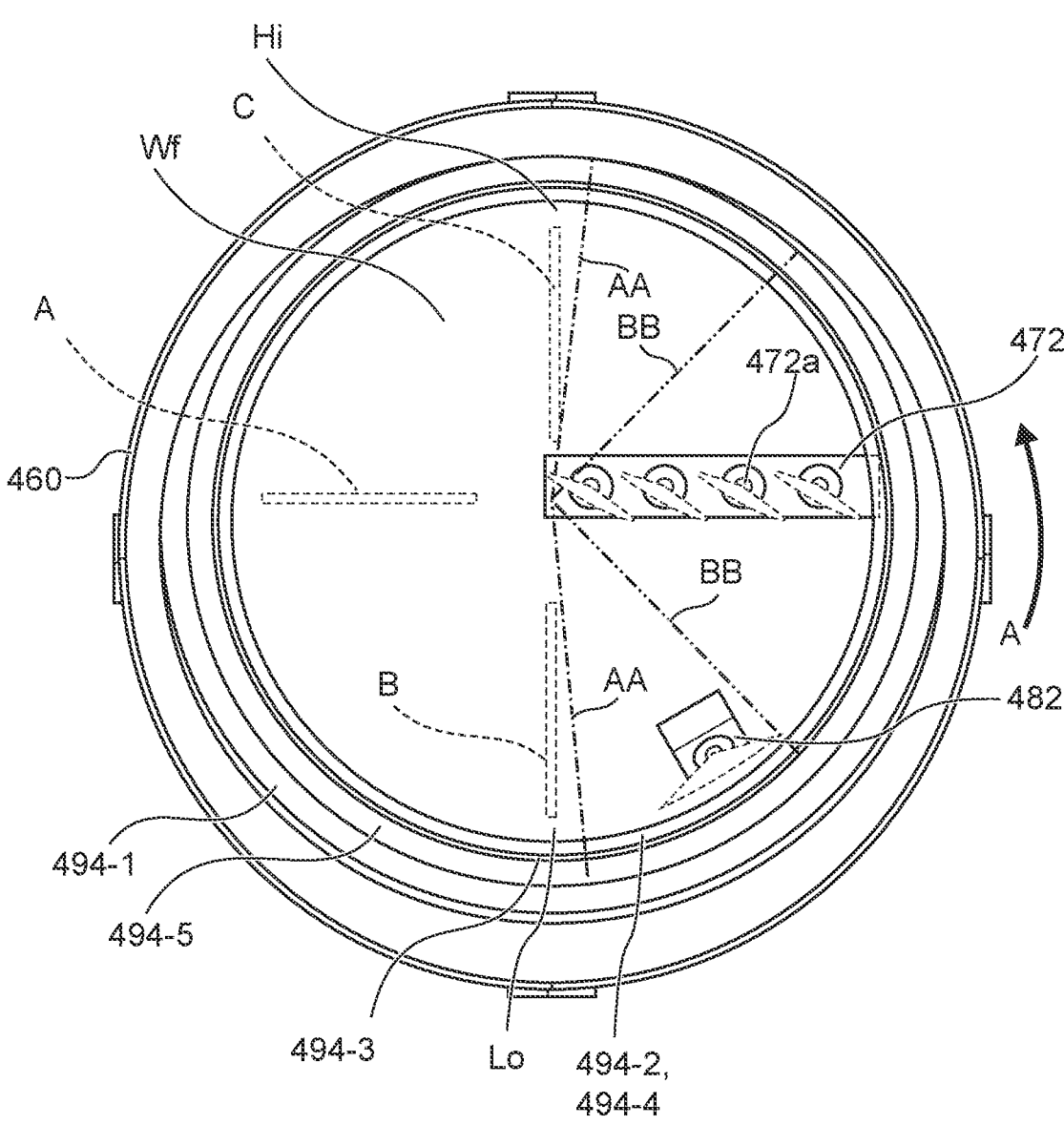
FIG. 9 is a plan view schematically illustrating the configuration of the plating module of this embodiment.
Figure 10:
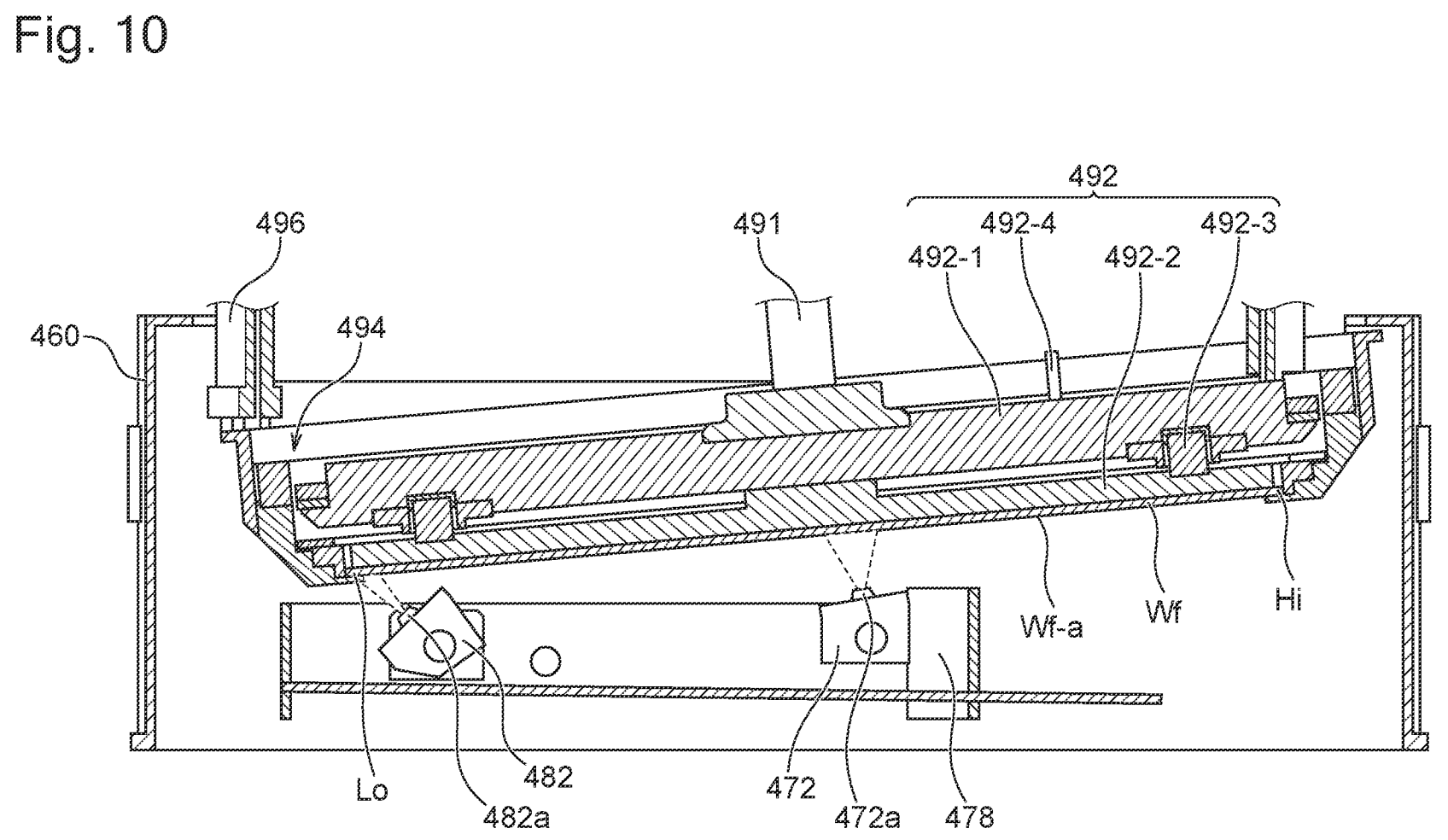
Figure 11:
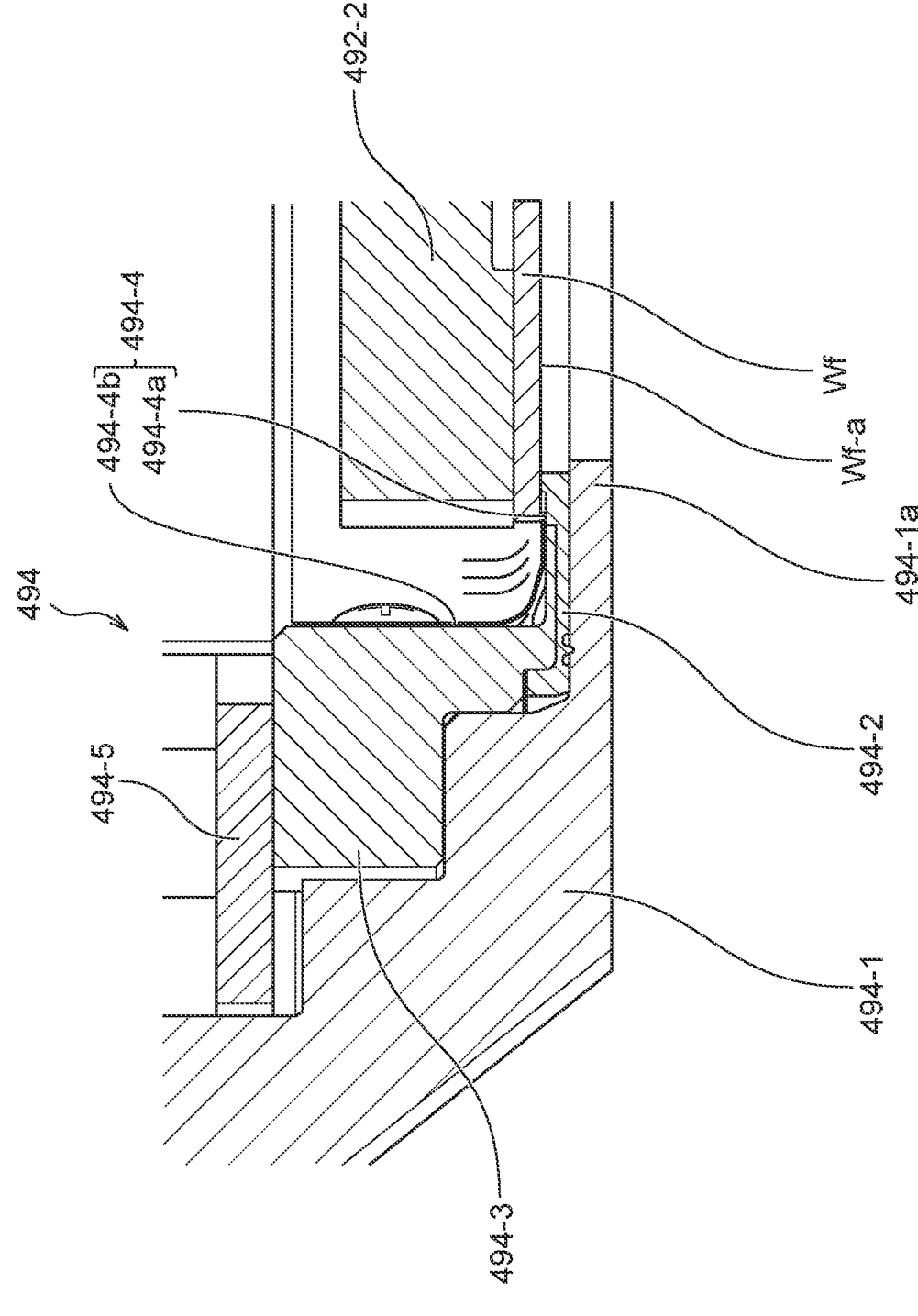
FIG. 11 is an enlarged vertical cross-sectional view schematically illustrating a part of the configuration of the plating module of this embodiment.

FIG. 9 is a plan view schematically illustrating the configuration of the plating module of this embodiment. FIG. 10 is a vertical cross-sectional view schematically illustrating the configuration of the plating module of this embodiment. FIG. 11 is an enlarged vertical cross-sectional view schematically illustrating a part of the configuration of the plating module of this embodiment.

As illustrated in FIG. 10, the substrate holder 440 includes a supporting mechanism 494 for supporting the outer peripheral portion of the surface to be plated Wf-a of the substrate Wf, a back plate assembly 492 for sandwiching the substrate Wf together with the supporting mechanism 494, and a rotation shaft 491 extending vertically upward from the back plate assembly 492. The supporting mechanism 494 is a ring-shaped member having an opening in the center for exposing the surface to be plated Wf-a of the substrate Wf and is suspended and held by a column member 496.

The back plate assembly 492 includes a circular plate-shaped floating plate 492-2 for sandwiching the substrate Wf together with the supporting mechanism 494. The floating plate 492-2 is arranged on the back surface side of the surface to be plated Wf-a of the substrate Wf. Further, the back plate assembly 492 includes a circular plate-shaped back plate 492-1 arranged above the floating plate 492-2. Further, the back plate assembly 492 includes a floating mechanism 492-4 for biasing the floating plate 492-2 to a direction away from the back surface of the substrate Wf and a pressing mechanism 492-3 for pressing the floating plate 492-2 to the back surface of the substrate Wf against a biasing force by the floating mechanism 492-4.

The floating mechanism 492-4 includes a compression spring attached between the upper end of a shaft that passes through the back plate 492-1 from the floating plate 492-2 and extends upward and the back plate 492-1. The floating mechanism 492-4 is configured to lift the floating plate 492-2 upward via the shaft by a compression reactive force of the compression spring and bias the floating plate 492-2 to the direction away from the back surface of the substrate Wf.

The pressing mechanism 492-3 is configured to press the floating plate 492-2 downward by supplying a fluid to the floating plate 492-2 via a flow passage formed in an inside of the back plate 492-1. When the fluid is supplied, the pressing mechanism 492-3 presses the substrate Wf to the supporting mechanism 494 by a force stronger than the biasing force by the floating mechanism 492-4.

As illustrated in FIG. 11, the supporting mechanism 494 includes a ring-shaped supporting member 494-1 for supporting the outer peripheral portion of the surface to be plated Wf-a of the substrate Wf. The supporting member 494-1 has a flange 494-1a projecting to an outer peripheral portion of the lower surface of the back plate assembly 492 (floating plate 492-2). A ring-shaped sealing member 494-2 is arranged on the flange 494-1a.

The sealing member 494-2 is a member having elasticity. The supporting member 494-1 supports the outer peripheral portion of the surface to be plated Wf-a of the substrate Wf via the sealing member 494-2. By sandwiching the substrate Wf between the sealing member 494-2 and the floating plate 492-2, sealing is made between the supporting member 494-1 (substrate holder 440) and the substrate Wf.

The supporting mechanism 494 includes a ring-shaped pedestal 494-3 attached on the inner circumference surface of the supporting member 494-1 and a ring-shaped conductive member 494-5 attached on the upper surface of the pedestal 494-3. The pedestal 494-3 is a member having a conductive property of, for example, stainless steel and the like. The conductive member 494-5 is a ring-shaped member having a conductive property of, for example, copper and the like.

The supporting mechanism 494 includes a contact member 494-4 for feeding power to the substrate Wf. The contact member 494-4 is circularly attached on the inner circumference surface of the pedestal 494-3 by a screw or the like. The supporting member 494-1 holds the contact member 494-4 via the pedestal 494-3. The contact member 494-4 is a member having a conductive property for feeding power to the substrate Wf held by the substrate holder 440 from a power source (not illustrated). The contact member 494-4 has a plurality of substrate contact points 494-4a that are in contact with the outer peripheral portion of the surface to be plated Wf-a of the substrate Wf and a main body 494-4b extending above with respect to the substrate contact points 494-4a.

When the plating process is performed on the substrate Wf, sealing is made between the supporting member 494-1 and the substrate Wf by sandwiching the substrate Wf between the sealing member 494-2 and the back plate assembly 492.

As illustrated in FIG. 9 and FIG. 10, the inclination mechanism 447 inclines the substrate holder 440. This also inclines the substrate Wf held by the substrate holder 440. In FIG. 9, illustration of members, such as the tray member 478, is omitted for convenience of explanation.

The substrate cleaning member 472 is arranged to be opposed to a region having an upward rotation component of the substrate Wf that is inclined by the inclination mechanism 447 and is rotated by the rotation mechanism 446. In other words, the substrate cleaning member 472 is configured to discharge the cleaning liquid to the surface to be plated Wf-a of the substrate Wf rotated by the rotation mechanism 446 from a position Lo corresponding to the lower end of the substrate Wf inclined by the inclination mechanism 447 toward a position Hi corresponding to the upper end.

Each of the plurality of substrate cleaning nozzles 472a is a circular sector nozzle configured to discharge the cleaning liquid in a fan shape that spreads as separating from a tip of the substrate cleaning nozzle 472a. As illustrated in FIG. 9, each of the plurality of substrate cleaning nozzles 472a is configured so that the cleaning liquids discharged from the neighboring substrate cleaning nozzles 472a do not collide with one another and partially overlap in the rotation direction of the substrate Wf indicated by an arrow A in the drawing. This can clean the entire surface to be plated Wf-a of the substrate Wf.

Figure 12A:
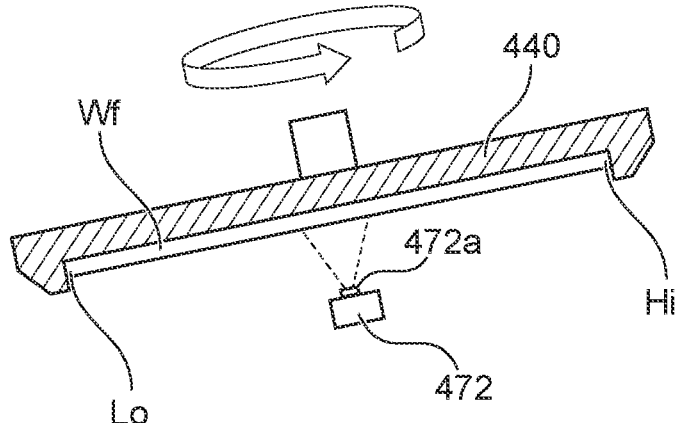
FIG. 12A is a drawing schematically illustrating an arrangement relationship between a rotation direction of a substrate and a substrate cleaning nozzle.
Figure 12B:
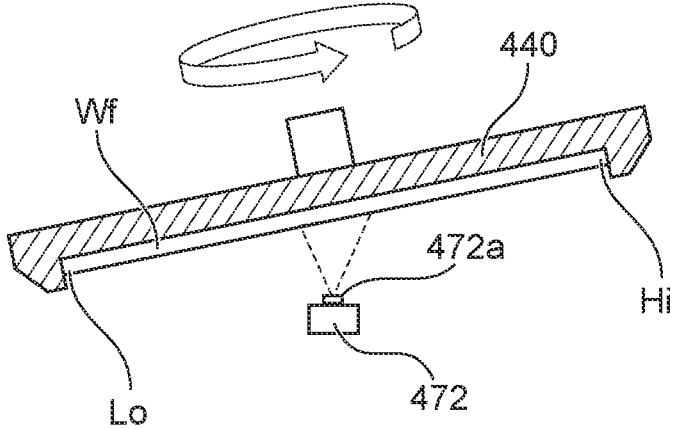
FIG. 12B is a drawing illustrating a modification of a cleaning liquid discharge direction of the substrate cleaning nozzle.

FIG. 12A is a drawing schematically illustrating an arrangement relationship between the rotation direction of a substrate and a substrate cleaning nozzle. As illustrated in FIG. 12A, the substrate cleaning member 472 and the substrate cleaning nozzles 472a can discharge the cleaning liquid toward the surface to be plated Wf-a of the substrate Wf in a state of being inclined similarly to an inclination of the substrate Wf FIG. 12B is a drawing illustrating a modification of a cleaning liquid discharge direction of the substrate cleaning nozzle. As illustrated in FIG. 12B, the substrate cleaning nozzles 472a may discharge the cleaning liquid vertically upward regardless of the inclination of the substrate Wf.

With this embodiment, the substrate Wf can be efficiently cleaned. That is, when the cleaning liquid collides with a surface to be plated in a state where the substrate Wf is horizontalized, the plating solution accumulated on the surface to be plated is swept away by the cleaning liquid, and a part of the plating solution drops and is recovered. However, the remaining part of the plating solution moves to a downstream side of a cleaning region in association with a rotation of the substrate while accumulating on the surface to be plated of the substrate. Since the plating solution that has moved to the downstream side of the cleaning region is not cleaned until the substrate rotates 360° and the plating solution moves again to the cleaning region, in order to clean the entire surface to be plated sufficiently, time period for the cleaning process becomes longer.

In contrast to this, with this embodiment, since the substrate Wf is inclined, the plating solution swept away by the cleaning liquid flows to a direction (lower side in FIG. 9) along the inclination according to gravity. Further, with this embodiment, since the cleaning liquid is discharged to a region that rotates having an upward component of the substrate, a cleaned region of the substrate Wf rotates having the upward component (the arrow A direction in FIG. 9). Therefore, when viewed in a plan view as illustrated in FIG. 9, an angle formed by a flow direction of the plating solution swept away by the cleaning liquid and the rotation direction of the cleaned region of the substrate Wf becomes approximately 180°. That is, since the direction in which the cleaned region of the substrate Wf rotates and the direction in which the plating solution flows are exactly opposite, it becomes hard to mix the plating solution in the cleaned region of the substrate Wf, and as a result, the entire surface to be plated can be sufficiently cleaned in a short time.

Figure 13:
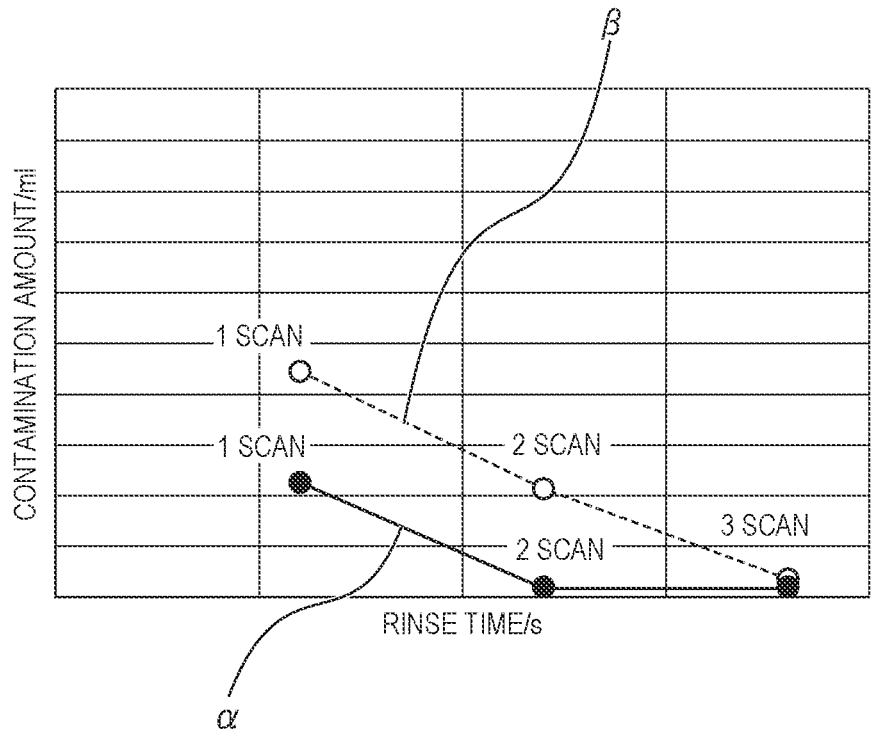
FIG. 13 is a drawing illustrating a result of cleaning by this embodiment and cleaning by a comparative example.

FIG. 13 is a drawing illustrating a result of cleaning by this embodiment and cleaning by a comparative example. In FIG. 13, the vertical axis indicates a contamination amount (plating solution amount) that remains on the surface to be plated Wf-a of the substrate Wf, and the horizontal axis indicates a cleaning time (how many rotations the substrate holder makes). In FIG. 13, a graph a indicates the contamination amount by this embodiment, and a graph R indicates the contamination amount by the comparative example. The comparative example indicates the contamination amount when the cleaning process was performed in a state where the rotation speed of the substrate holder 440 was not changed (10 rpm) and the rotation direction was reversed.

As illustrated in FIG. 13, in the comparative example, the contamination still remained in a state where the substrate holder 440 was rotated twice. On the other hand, in this embodiment, the contamination amount reduced in a shorter time than in the comparative example, and the contamination amount became almost zero in a state where the substrate holder 440 was rotated twice. Thus, with this embodiment, the substrate Wf can be efficiently cleaned.

In this embodiment, while the example in which the angle formed by the flow direction of the plating solution swept away by the cleaning liquid and the rotation direction of the cleaned region of the substrate Wf becomes approximately 180° when viewed in a plan view as illustrated in FIG. 9 has been illustrated, the present invention is not limited to this. For example, when the substrate cleaning member 472 is arranged in a region A indicated by a dashed line in FIG. 9, the angle formed by the flow direction of the plating solution and the rotation direction of the cleaned region of the substrate Wf becomes 0°. In this case, since the direction in which the cleaned region of the substrate Wf rotates and the direction in which the plating solution flows become identical, an effect of this embodiment cannot be obtained (the above-described comparative example). When the substrate cleaning member 472 is arranged in a region B, the angle becomes 90°, and when the substrate cleaning member 472 is arranged in a region C, the angle becomes 270°. In these cases, the effect of this embodiment is limited.

On the other hand, when the angle becomes larger than 90° and smaller than 270°, it becomes hard to mix the plating solution in the cleaned region of the substrate Wf Therefore, the substrate cleaning member 472 can be configured to discharge the cleaning liquid so that the angle becomes larger than 900 and smaller than 270°, in other words, to the surface to be plated (region sandwiched between one-dot chain lines AA-AA in FIG. 9) of the substrate rotated from the position Lo corresponding to the lower end of the inclined substrate Wf toward the position Hi corresponding to the upper end. It is more preferable that the substrate cleaning member 472 discharges the cleaning liquid so that the angle becomes larger than 135° and smaller than 225°, in other words, to a region sandwiched between two-dot chain lines BB-BB in FIG. 9 because efficiency in cleaning further increases.

Figure 14:
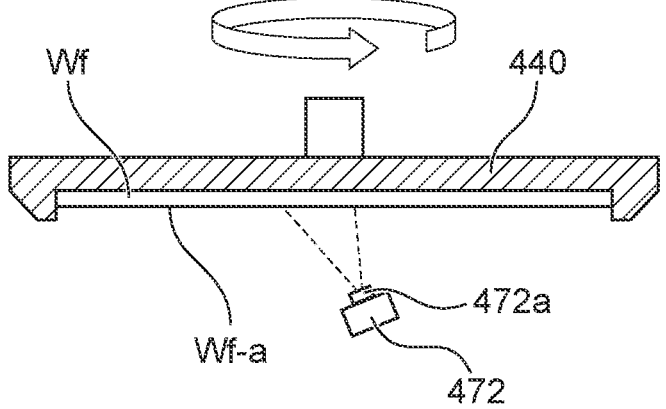
FIG. 14 is a side view schematically illustrating a configuration of a plating module of a modification.

In the above-described embodiment, while the example in which the cleaning process is performed in a state where the substrate Wf is inclined has been illustrated, the present invention is not limited to this. FIG. 14 is a side view schematically illustrating a configuration of a plating module of a modification. Since the plating module of this modification has a basic configuration similar to the plating module of the above-described embodiment, description of similar configurations will be omitted and only different configurations will be described.

As illustrated in FIG. 14, the plating module 400 of this modification is configured to perform the cleaning process in a state where the substrate holder 440 is not inclined and the surface to be plated Wf-a of the substrate Wf is retained approximately horizontal. The substrate cleaning member 472 is configured to discharge the cleaning liquid having a speed component in an opposite direction to the rotation direction of the substrate Wf rotated by the rotation mechanism 446.

Specifically, the substrate cleaning member 472 and the substrate cleaning nozzles 472*a* are arranged to be inclined so that the discharge direction of the cleaning liquid becomes a direction adverse to the rotation direction of the substrate Wf. The substrate cleaning member 472 can efficiently clean the substrate Wf by discharging the cleaning liquid toward the surface to be plated Wf-a of the substrate Wf in this state.

That is, by discharging the cleaning liquid as illustrated in this modification, the cleaning liquid that has collided with the surface to be plated Wf-a of the substrate Wf drops and is recovered while sweeping away the plating solution accumulating on the surface to be plated Wf-a to an upstream side of the substrate rotation direction. On the other hand, the cleaned region of the substrate Wf rotates to the downstream side of the substrate rotation direction. Therefore, since the direction in which the cleaned region of the substrate Wf rotates and the direction in which the plating solution flows are exactly opposite, it becomes hard to mix the plating solution in the cleaned region of the substrate Wf, and as a result, the entire surface to be plated can be sufficiently cleaned in a short time.

In this modification, since all the (four) substrate cleaning nozzles 472*a* arranged on the substrate cleaning member 472 discharge the cleaning liquid having the speed component in the opposite direction to the rotation direction of the substrate Wf, the above-described effect can be obtained. If a part of the substrate cleaning nozzles 472*a* arranged on the substrate cleaning member 472 discharge the cleaning liquid having the speed component in a direction following the rotation direction of the substrate Wf, the plating solution swept away by the cleaning liquid flows to the downstream of the rotation direction of the substrate. Accordingly, it becomes easy to mix the plating solution in the cleaned region of the substrate Wf, and the above-described effect cannot be obtained or reduces.

Figure 15A:
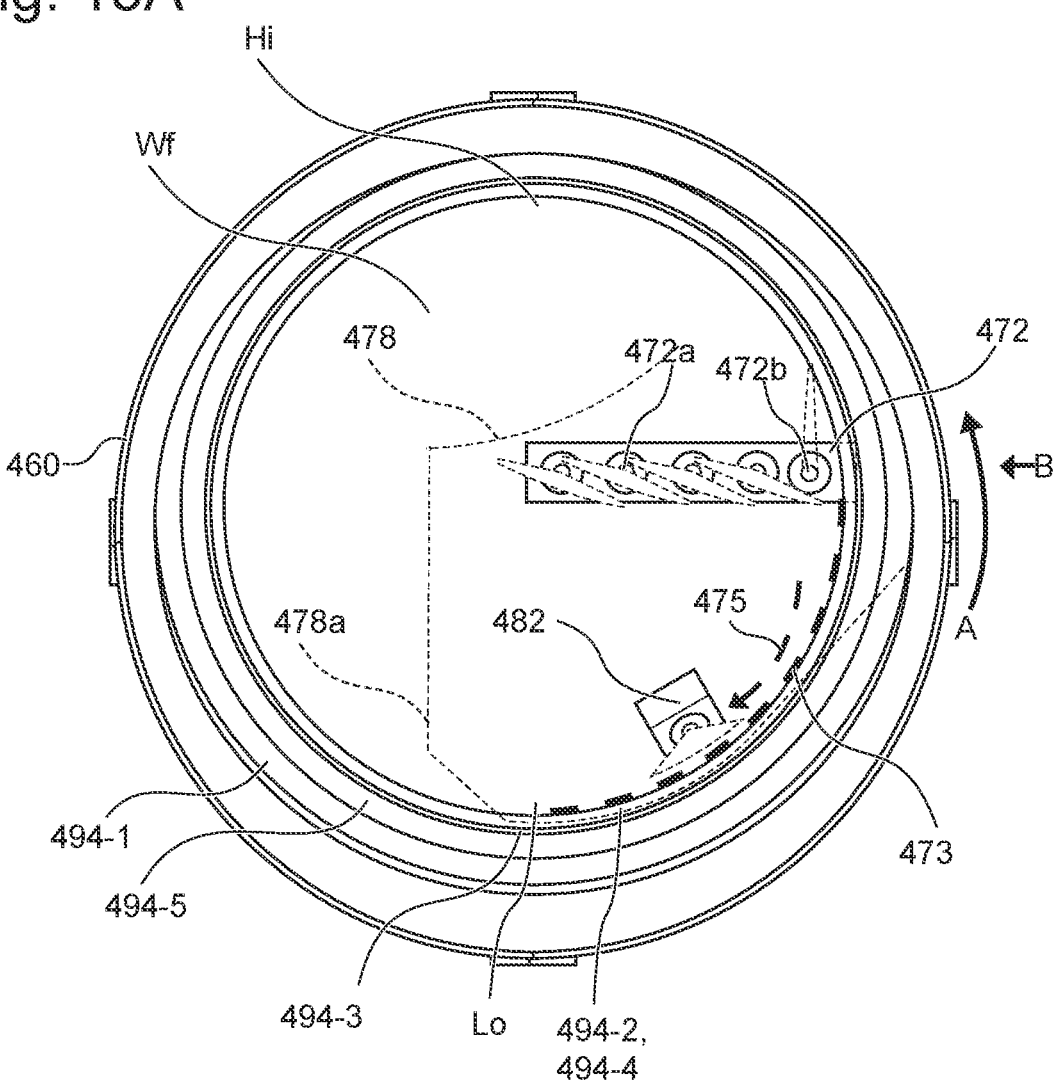
FIG. 15A is a plan view schematically illustrating a configuration of a plating module of a modification.
Figure 15B:
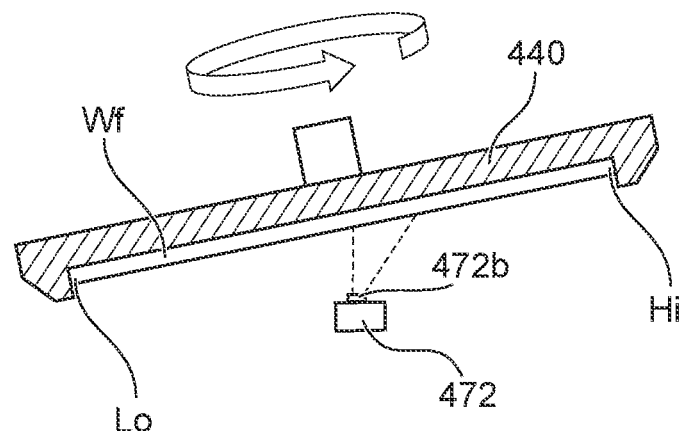
FIG. 15B is a schematic side view of the plating module illustrated in FIG. 15A when viewed in an arrow B direction.

In above-described embodiment, while the example in which the four substrate cleaning nozzles 472*a* are arranged on the substrate cleaning member 472 has been illustrated, the present invention is not limited to this. FIG. 15A is a plan view schematically illustrating a configuration of a plating module of a modification. FIG. 15B is a schematic side view of the plating module illustrated in FIG. 15A when viewed in an arrow B direction. In FIG. 15, description of configurations that overlap with the embodiment in FIG. 9 will be omitted.

As illustrated in FIG. 15A, the substrate cleaning member 472 includes the plurality (four pieces) of substrate cleaning nozzles 472*a* and a sealing cleaning nozzle 472*b* arranged on the outer peripheral side of a substrate with respect to these plurality of substrate cleaning nozzles 472*a*. The sealing cleaning nozzle 472*b* is a member for cleaning the sealing member 494-2 for sealing between the substrate holder 440 and the substrate Wf.

The sealing cleaning nozzle 472b is a circular sector nozzle configured to discharge the cleaning liquid in a fan shape to a direction of the substrate holder 440 that faces vertically upward and is inclined at a relatively high position. The sealing cleaning nozzle 472b is configured to discharge the cleaning liquid having a speed component in a direction along the rotation direction of the sealing member 494-2 that rotates in a direction indicated by the arrow A in FIG. 15A toward the inner circumference surface of the sealing member 494-2.

With this modification, the sealing member 494-2 can be efficiently cleaned. That is, in a region indicated by a dashed line 473 in FIG. 15A, the cleaning liquid discharged from the substrate cleaning nozzles 472a flows down along the inclination of a substrate after colliding with the substrate. This forms a thick liquid film of the cleaning liquid on the inner circumference surface of the sealing member 494-2 in the region indicated by the dashed line 473. Therefore, if the cleaning liquid is discharged toward the sealing member 494-2 in a downward direction in FIG. 15A from the sealing cleaning nozzle 472b, it is difficult to apply the cleaning liquid to the sealing member 494-2 with a sufficient hitting power due to hindrance of the thick liquid film. As a result, cleaning efficiency of the sealing member 494-2 is poor.

In contrast to this, in this modification, the sealing cleaning nozzle 472b is configured to discharge the cleaning liquid toward the sealing member 494-2 attached to a relatively high position of the inclined substrate holder 440. Therefore, since the liquid film is not formed or is thin on the inner circumference surface of the sealing member 494-2 with which the cleaning liquid collides, the sealing member 494-2 can be cleaned with a sufficient hitting power, and as a result, the sealing member 494-2 can be efficiently cleaned.

In addition to this, with this modification, a size of the tray member 478 becoming larger can be suppressed. That is, if the cleaning liquid is discharged toward the sealing member 494-2 in the downward direction in FIG. 15A from the sealing cleaning nozzle 472b, the discharged cleaning liquid collides with the liquid film, and thereby the liquid film is swept away to a direction indicated by a dashed line arrow 475 along the inner circumference surface of the sealing member 494-2. Then, the swept liquid film possibly drops out to an outer side of a distal end portion 478a of the tray member 478. Although it is conceivable that the size of the tray member 478 is increased by, for example, broadening the distal end portion 478a to avoid the cleaning liquid dropping out from the tray member 478, this is not preferable from the aspect of the entire device becoming larger in size or interference with other components.

In contrast to this, with this modification, the sealing cleaning nozzle 472b is configured to discharge the cleaning liquid toward the inner circumference surface of the sealing member 494-2 in a region where the liquid film is difficult to accumulate. Therefore, since the liquid film that has accumulated on the region indicated by the dashed line 473 is difficult to be swept away, it becomes difficult for the cleaning liquid to drop out of the tray member 478, and as a result, the size of the tray member 478 becoming larger can be suppressed.

Figure 16A:
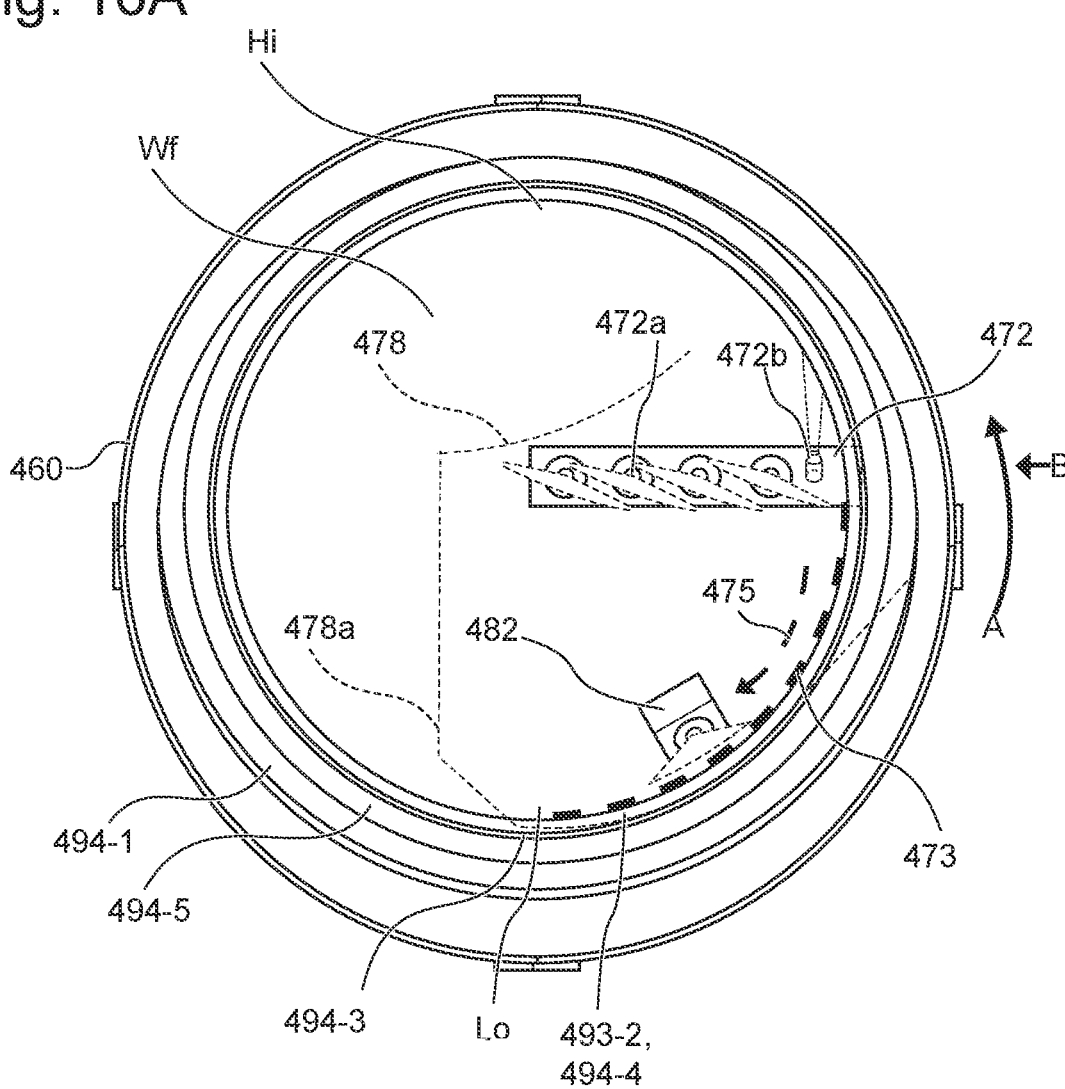
FIG. 16A is a plan view schematically illustrating a configuration of a plating module of a modification.
Figure 16B:
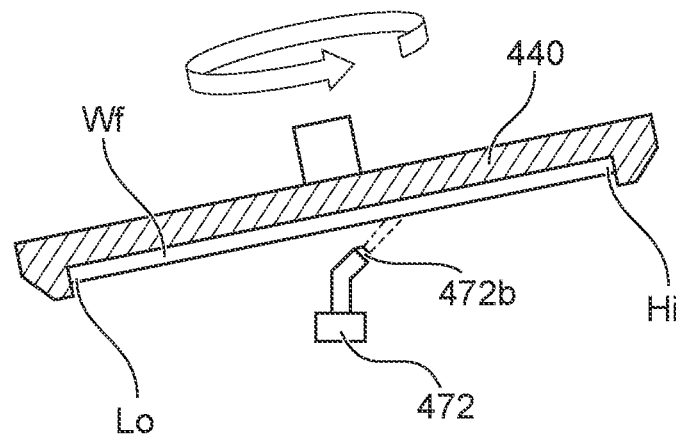
FIG. 16B is a schematic side view of the plating module illustrated in FIG. 16A when viewed in an arrow B direction.

In the modification illustrated in FIG. 15, while the example in which the sealing cleaning nozzle 472b is a circular sector nozzle has been illustrated, the present invention is not limited to this. FIG. 16A is a plan view schematically illustrating a configuration of a plating module of a modification. FIG. 16B is a schematic side view of the plating module illustrated in FIG. 16A when viewed in an arrow B direction. In FIG. 16, description of configurations that overlap with the modification in FIG. 15 will be omitted.

As illustrated in FIG. 16A, the sealing cleaning nozzle 472b may be a straight nozzle that discharges the cleaning liquid in a straight line. With this modification, similarly to the modification in FIG. 15, the sealing member 494-2 can be efficiently cleaned, and the size of the tray member 478 becoming larger can be suppressed.

In the above description, while the example in which the substrate cleaning member 472 is used for cleaning the plating solution from the surface to be plated Wf-a of the substrate Wf after the plating process has been illustrated, the present invention is not limited to this. In the plating module 400, the substrate cleaning member 472 can also be used for the pre-wet process. That is, using the substrate cleaning member 472, the plating module 400 wets the surface to be plated Wf-a of the substrate Wf before the plating process with the process liquid, such as pure water or deaerated water, thereby allowing replacing air inside a pattern formed on a substrate surface with the process liquid.

Figure 17A:
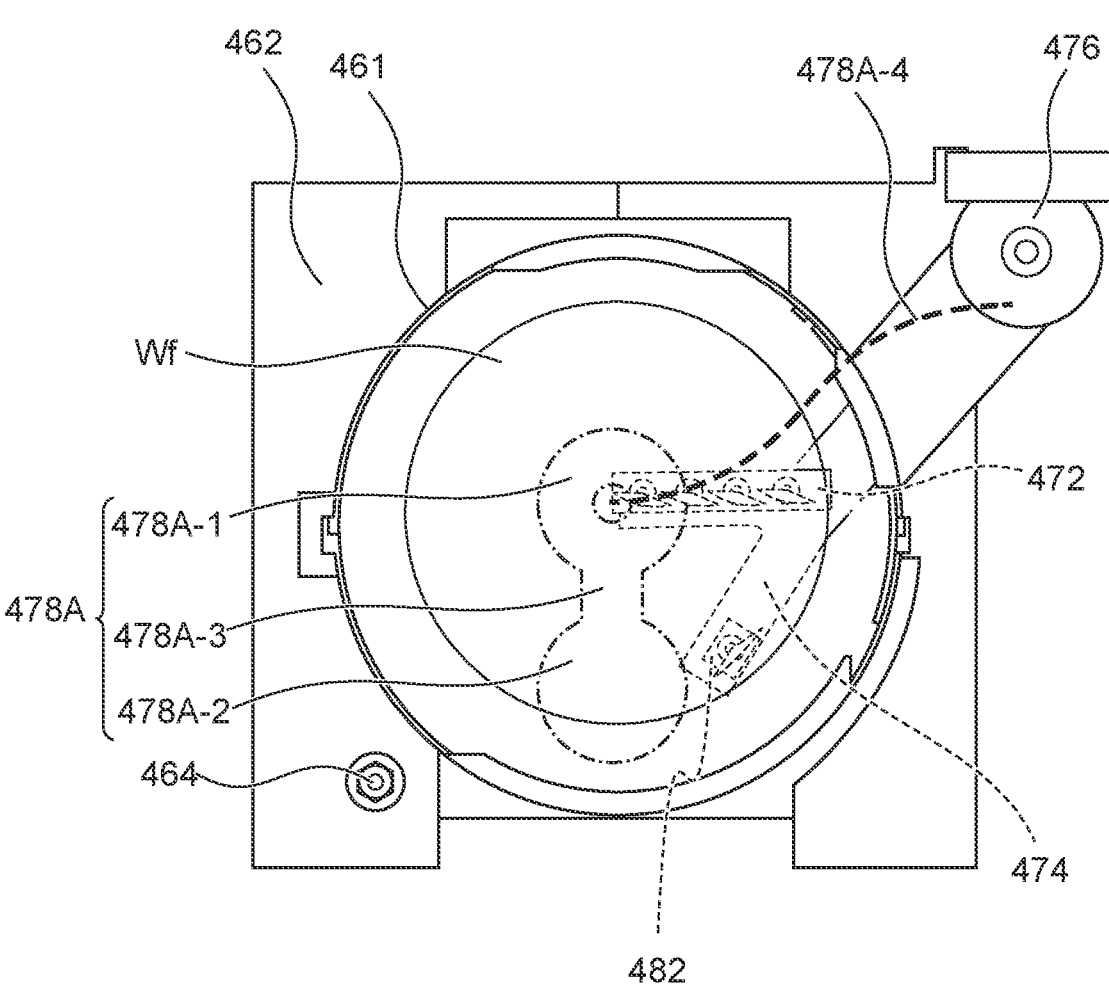
FIG. 17A is a plan view schematically illustrating a tray member of a modification.
Figure 17B:
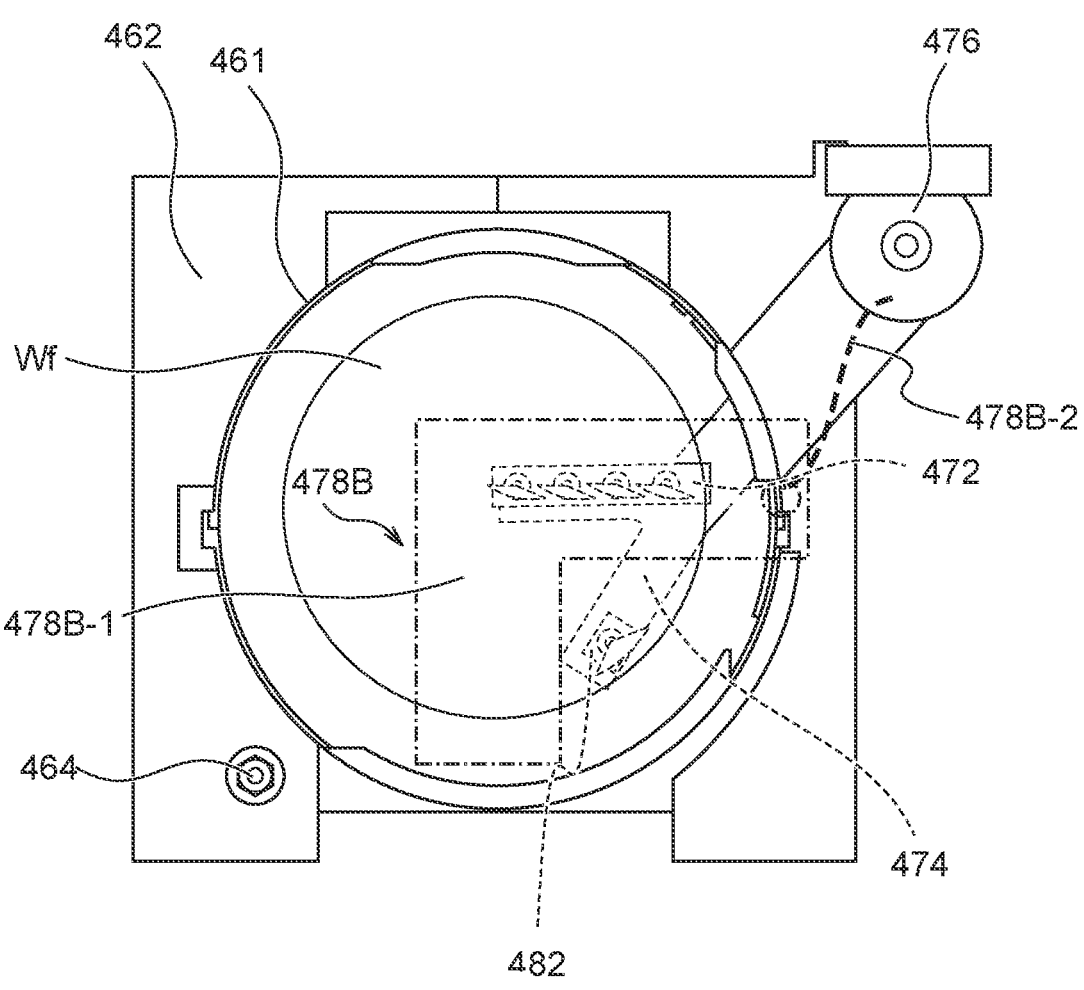
FIG. 17B is a plan view schematically illustrating a tray member of a modification.
Figure 17C:
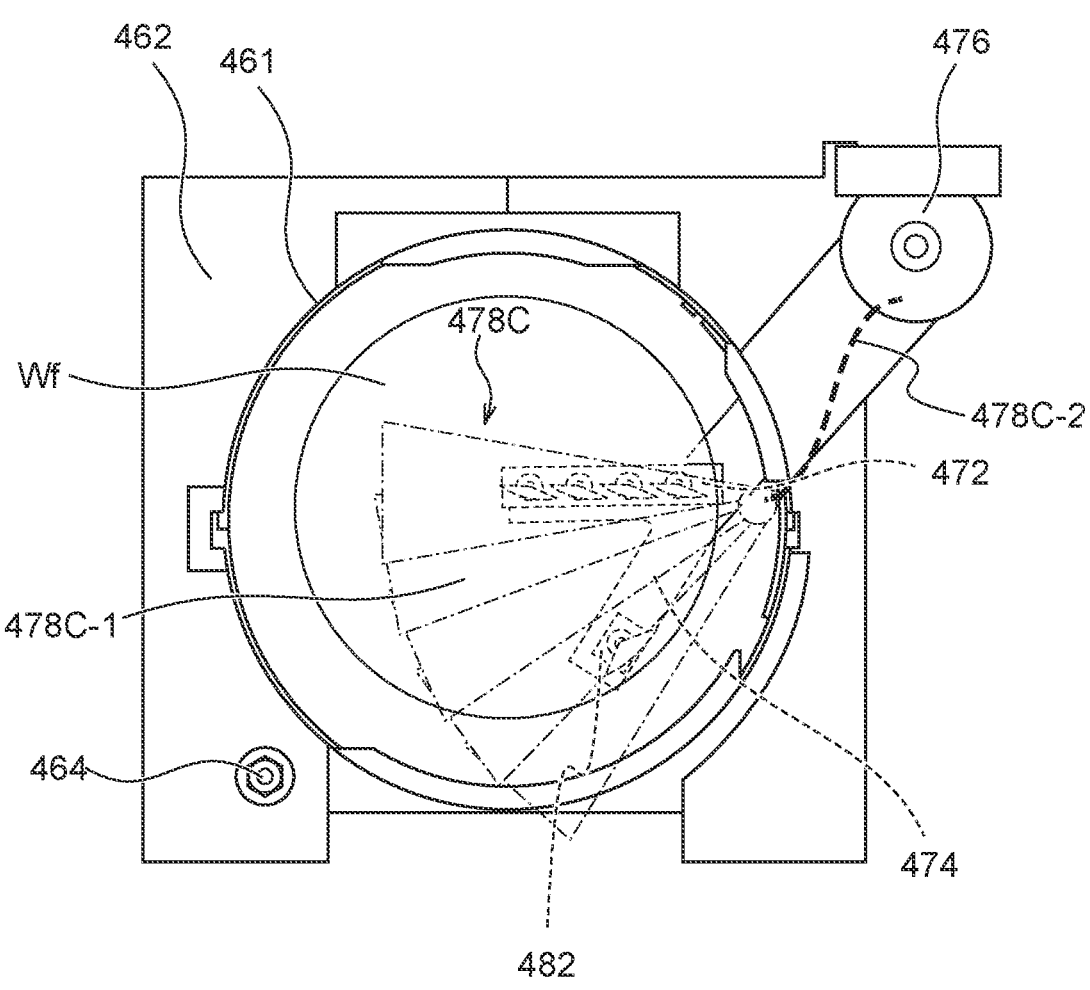
FIG. 17C is a plan view schematically illustrating a tray member of a modification.

In the above description, while the example in which the tray member 478 is configured to accommodate the whole of the substrate cleaning member 472, the contact cleaning member 482, and the arm 474 has been illustrated, the present invention is not limited to this. FIG. 17A to FIG. 17C are plan views schematically illustrating tray members of modifications.

As illustrated in FIG. 17A, a tray member 478A of the modification may be configured to have an approximately circular-shaped first tray 478A-1 arranged at a position corresponding to the center of the inclined substrate Wf, an approximately circular-shaped second tray 478A-2 arranged at a position corresponding to the lower end of the inclined substrate Wf, and a connecting tray 478A-3 that connects the first tray 478A-1 to the second tray 478A-2. A drainage pipe 478A-4 is connected to the center of the first tray 478A-1, and the cleaning liquid and the plating solution that flow through the drainage pipe 478A-4 drop in the fixed tray member 484.

Since the substrate Wf held by the substrate holder 440 bends and the center becomes slightly lower, the cleaning liquid discharged to the surface to be plated Wf-a of the substrate Wf flows to the center of the substrate Wf and drops or flows to the lower end of the inclined substrate Wf and drops. In this respect, in this modification, since the first tray 478A-1 is arranged at the position corresponding to the center of the substrate Wf and the second tray 478A-2 is arranged at the position corresponding to the lower end of the inclined substrate Wf, the cleaning liquid can be efficiently recovered.

As illustrated in FIG. 17B, a tray member 478B of the modification includes an L-shaped tray 478B-1 arranged at a position corresponding to the center and the lower end of the inclined substrate Wf A drainage pipe 478B-2 is connected to the L-shaped tray 478B-1, and the cleaning liquid and the plating solution that flow through the drainage pipe 478B-2 drop in the fixed tray member 484. In this modification as well, since the L-shaped tray 478B-1 is arranged at the position corresponding to the center and the lower end of the substrate Wf, the cleaning liquid can be efficiently recovered.

As illustrated in FIG. 17C, a tray member 478C of the modification includes a plurality (five pieces, in this modification) of triangle-shaped trays 478C-1. The respective plurality of triangle-shaped trays 478C-1 are arranged to be stacked in the vertical direction and rotatable around apices of the respective trays 478C-1. A drainage pipe 478C-2 is connected to the plurality of triangle-shaped trays 478C-1, and the cleaning liquid and the plating solution that flow through the drainage pipe 478C-2 drop in the fixed tray member 484. When the plurality of triangle-shaped trays 478C-1 are arranged at the cleaning position as illustrated in FIG. 17C, each is arranged in a different rotation angle to form a fan shape as a whole. With this, since the plurality of triangle-shaped trays 478C-1 are arranged at the position corresponding to the center and the lower end of the substrate Wf, the cleaning liquid can be efficiently recovered. On the other hand, when the plurality of triangle-shaped trays 478C-1 are arranged at the retracted position, each is arranged in an identical rotation angle, thereby allowing reducing an installation space of the tray member 478C.

<Cleaning of Contact Member>

Figure 18:
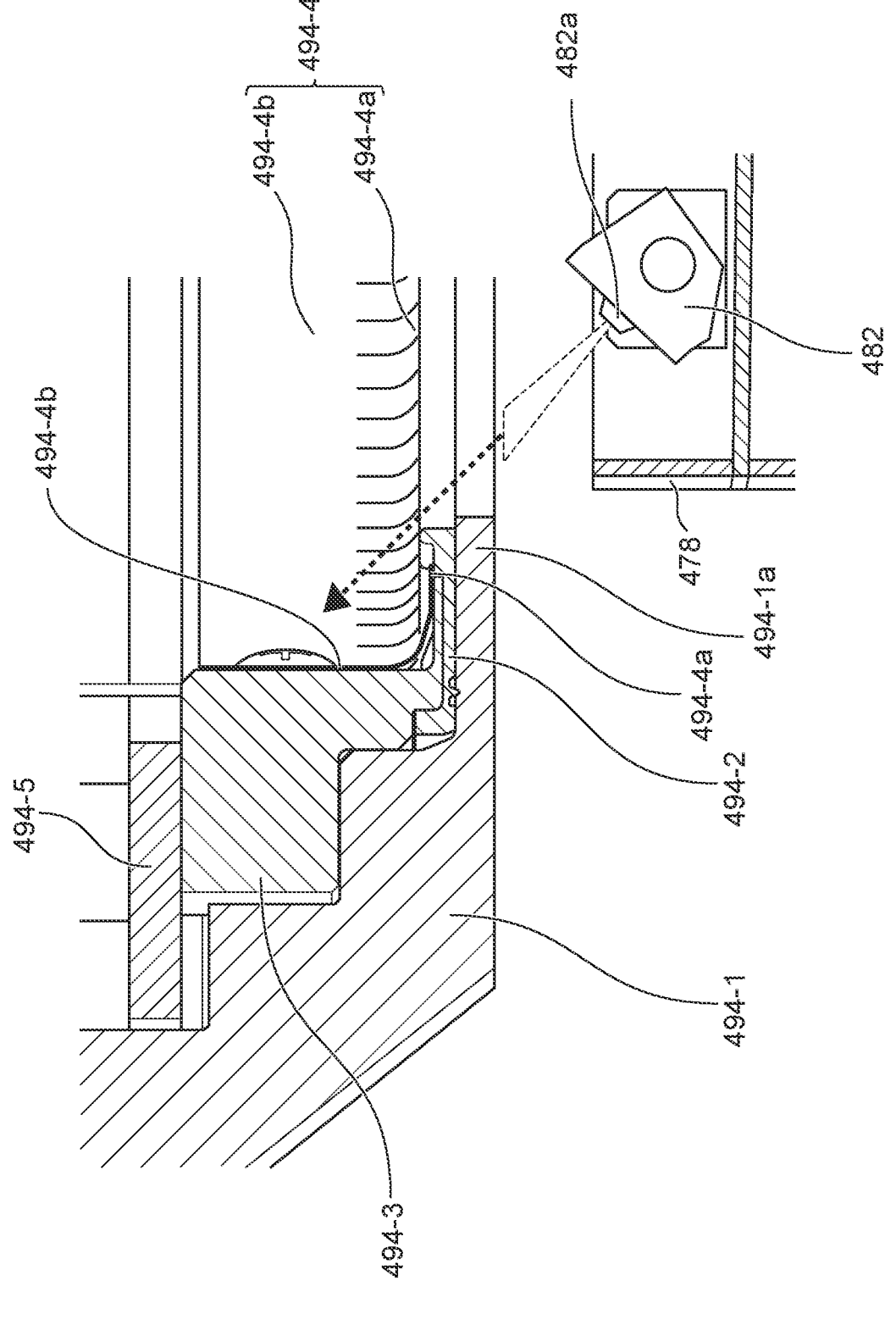
FIG. 18 is a drawing schematically illustrating cleaning of a contact member by the plating module of this embodiment.

Next, cleaning of the contact member attached to the substrate holder 440 will be described. FIG. 18 is a drawing schematically illustrating cleaning of the contact member by the plating module of this embodiment. Description of configurations similar to the members described using FIG. 11 will be omitted.

As described using FIG. 11, when the plating process is performed on the substrate Wf, sealing is made between the supporting member 494-1 and the substrate Wf by sandwiching the substrate Wf between the sealing member 494-2 and the back plate assembly 492. However, when a slight gap exists between the sealing member 494-2 and the substrate Wf, the plating solution invades and accumulates on the contact member 494-4 in some cases. When the substrate Wf is moved up after the plating process, the plating solution drops from the substrate Wf and accumulates on the contact member 494-4 in some cases.

Then, as illustrated in FIG. 18, the contact cleaning member 482 (contact cleaning nozzle 482a) is configured to discharge the cleaning liquid toward the main body 494-4b of the contact member from the lower side of the substrate holder 440. Specifically, when the contact member 494-4 is cleaned, the back plate assembly 492 is arranged at a position higher than a position surrounded by the contact member 494-4 and not illustrated in FIG. 18. The contact cleaning member 482 is configured to discharge the cleaning liquid to the main body 494-4b through the opening of the supporting mechanism 494 (supporting member 494-1). The contact cleaning nozzle 482a is a circular sector nozzle configured to discharge the cleaning liquid in a fan shape. In FIG. 18, while the example in which the contact cleaning nozzle 482a discharges the cleaning liquid at an elevation angle of about 450 with respect to the horizontal surface has been illustrated, the present invention is not limited to this, and a discharge angle of the cleaning liquid is arbitrary. Since the cleaning liquid that has collided with the main body 494-4b flows downward from the main body 494-4b by gravity, the plating solution accumulating on the main body 494-4b and the substrate contact points 494-4a is cleaned and recovered in the tray member 478.

With this embodiment, the contact member can be cleaned with a simple structure. That is, in this embodiment, the contact cleaning member 482 is arranged at the cleaning position below the substrate holder 440 by the driving mechanism 476, and the cleaning liquid is discharged to the main body 494-4b through the opening of the supporting mechanism 494 (supporting member 494-1). Therefore, since it is not necessary that the contact member is cleaned using a brush or that a nozzle is arranged at a lateral side or above the contact member, the contact member can be cleaned with a simple structure.

Figure 19:
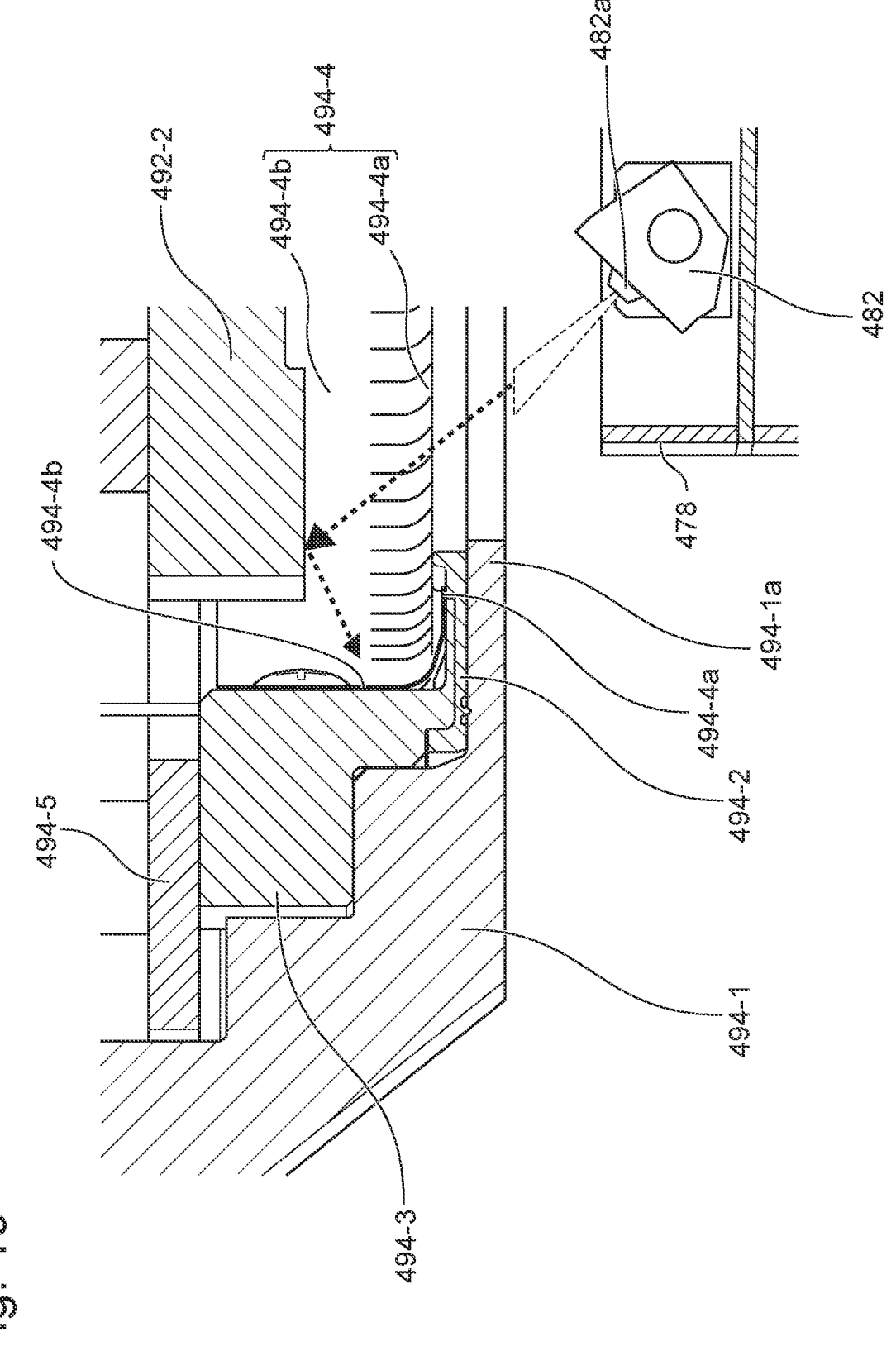
FIG. 19 is a drawing schematically illustrating cleaning of the contact member by the plating module of this embodiment.

In the above-described embodiment, while the example in which the cleaning liquid discharged from the contact cleaning nozzle 482a directly collides with the main body 494-4b has been illustrated, the present invention is not limited to this. FIG. 19 is a drawing schematically illustrating cleaning of the contact member by the plating module of this embodiment. As illustrated in FIG. 19, in this embodiment, when the contact member 494-4 is cleaned, the back plate assembly 492 (floating plate 492-2) is arranged at the position surrounded by the contact member 494-4.

The contact cleaning member 482 is configured to discharge the cleaning liquid toward the lower surface of the back plate assembly 492 and aim the cleaning liquid that has bounced after hitting against the lower surface of the back plate assembly 492 toward the main body 494-4b. The cleaning liquid that has bounced after hitting against the lower surface of the back plate assembly 492 flows downward from the main body 494-4b by gravity after colliding with the main body 494-4b. This causes the plating solution accumulating on the main body 494-4b and the substrate contact points 494-4a to drop together with the cleaning liquid and be recovered in the tray member 478.

With this embodiment, similarly to the above-described embodiment, the contact member can be cleaned with a simple structure. In addition to this, with this embodiment, generation of rust on metallic members (for example, the conductive member 494-5) attached to the substrate holder 440 can be suppressed. That is, in a technique in which the contact cleaning member 482 is arranged above or at the lateral side of the contact member 494-4 when the contact member 494-4 is cleaned, since the contact cleaning member 482 possibly comes in contact with the back plate assembly 492, the back plate assembly 492 is to be retracted to a high position. Then, the cleaning liquid that has been discharged from the contact cleaning member 482 and collided with the contact member 494-4 possibly splashes and accumulates on the metallic members (for example, the conductive member 494-5), generating rust. In order for the splashing cleaning liquid not to accumulate on the metallic members, the arrangement position of the contact cleaning member 482, the discharge angle of the cleaning liquid, discharging strength of the cleaning liquid, and the like should be precisely controlled, which is not preferred.

In contrast to this, in this embodiment, the contact cleaning member 482 is arranged below the substrate holder 440, and the cleaning liquid is discharged from the lower side of the substrate holder 440. Therefore, since a space is created at the position surrounded by the contact member 494-4, the back plate assembly 492 can be arranged in this space. As illustrated in FIG. 19, since the back plate assembly 492 becomes a wall against the metallic members (for example, the conductive member 494-5) located above with respect to the contact member 494-4, splashing of the cleaning liquid discharged from the contact cleaning member 482 to the metallic members can be suppressed. As a result, with this embodiment, the arrangement position of the contact cleaning member 482, the discharge angle of the cleaning liquid, the discharging strength of the cleaning liquid, and the like need not be precisely controlled, and the contact member 494-4 can be easily cleaned.

Figure 20:
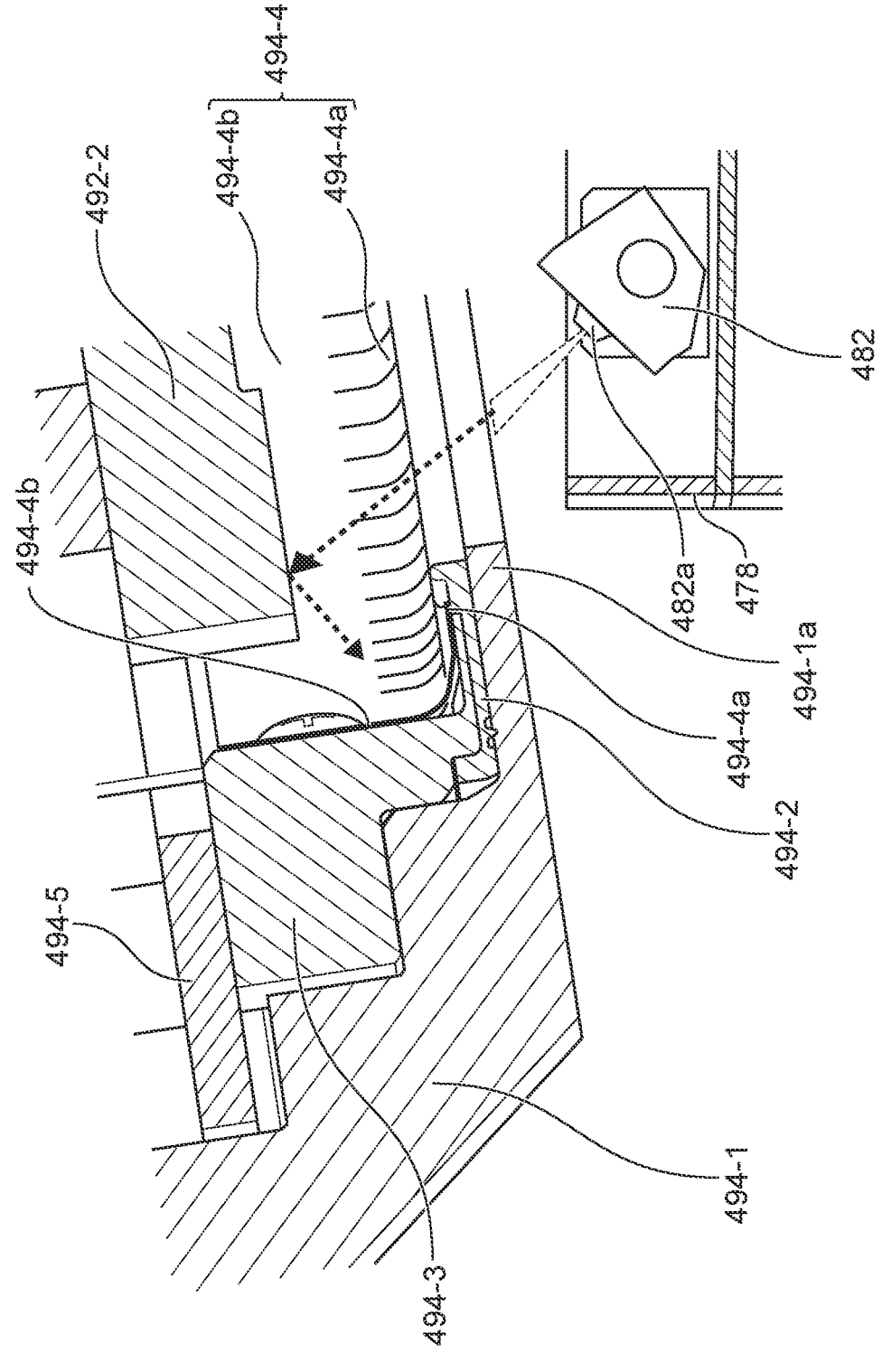
FIG. 20 is a drawing schematically illustrating cleaning of the contact member by the plating module of this embodiment.

While the example in which the contact member 494-4 is cleaned in a state where the substrate holder 440 is horizontalized has been illustrated above, the present invention is not limited to this. FIG. 20 is a drawing schematically illustrating cleaning of the contact member by the plating module of this embodiment.

As illustrated in FIG. 20, the contact cleaning member 482 may clean the contact member 494-4 in a state where the substrate holder 440 is inclined by the inclination mechanism 447. In this case, as illustrated in FIG. 20, the contact cleaning member 482 can discharge the cleaning liquid toward the main body 494-4b of the contact member 494-4 attached to the substrate holder 440 that is inclined by the inclination mechanism 447 and located at a relatively low position.

Figure 21:
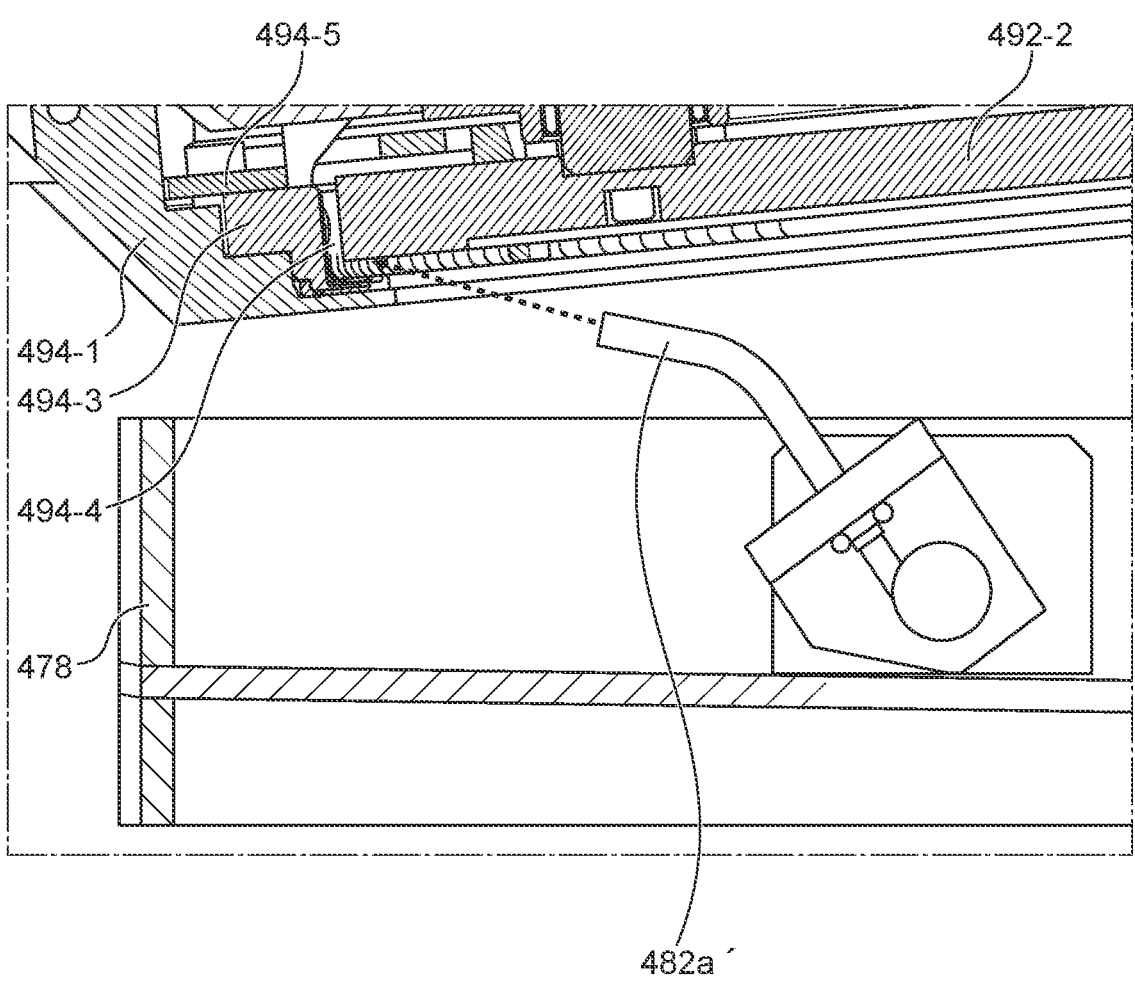
FIG. 21 is a drawing schematically illustrating a modification of a contact cleaning nozzle.

In the above-described embodiment, while the example in which the cleaning liquid is discharged from the contact cleaning nozzle 482a in a fan shape has been illustrated, the present invention is not limited to this. FIG. 21 is a drawing schematically illustrating a modification of a contact cleaning nozzle. As illustrated in FIG. 21, a contact cleaning nozzle 482a' of the modification may be a straight nozzle that discharges the cleaning liquid in a straight line. By using the straight nozzle, the cleaning liquid can be discharged to an aimed position of the main body 494-4b of the contact member 494-4.

<Substrate Cleaning Method and Contact Cleaning Method>

Figure 22:
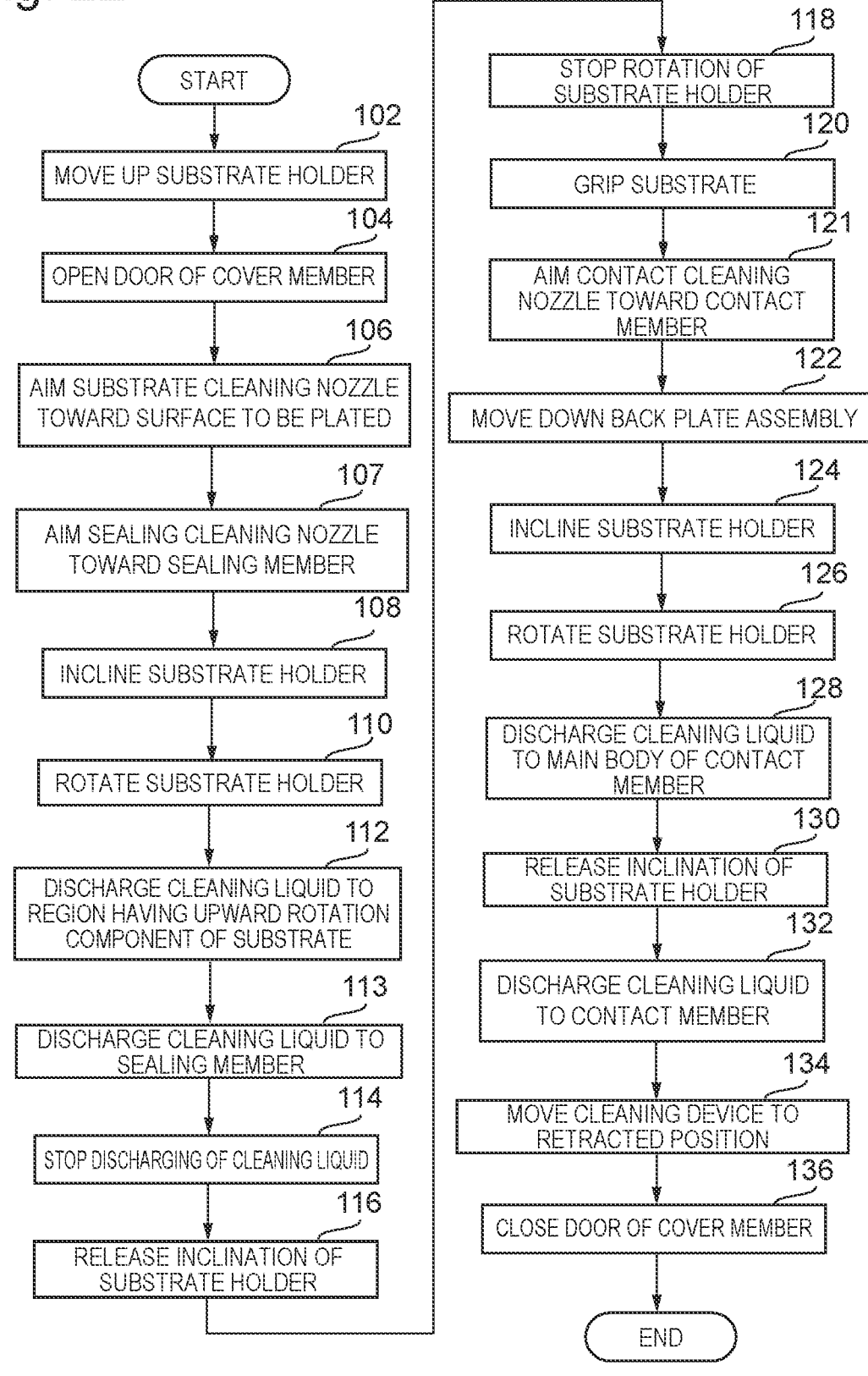
FIG. 22 is a flowchart illustrating a substrate cleaning method and a contact cleaning method of this embodiment.

Next, a substrate cleaning method and a contact cleaning method of this embodiment will be described. FIG. 22 is a flowchart illustrating the substrate cleaning method and the contact cleaning method of this embodiment. The flowchart of FIG. 22 illustrates each process after the substrate Wf held by the substrate holder 440 is immersed in the plating tank 410 and undergoes the plating process. Additionally, the flowchart of FIG. 22 illustrates the substrate cleaning method and the contact cleaning method using the plating module illustrated in FIG. 15 or FIG. 16.

In the substrate cleaning method, after the plating process ends, the substrate holder 440 is moved up from the plating tank 410 using the elevating mechanism 442, and the substrate holder 440 is arranged at the position surrounded by the cover member 460 (side wall 461) (moving-up step 102).

Subsequently, in the substrate cleaning method, the first door 468-1 and the second door 468-2 arranged in the opening 461a of the side wall 461 of the cover member 460 are moved to open the opening 461a (opening step 104). As illustrated in FIG. 5B, the opening step 104 allows rotationally moving the first door 468-1 and the second door 468-2 toward the inside of the cover member 460. However, the opening step 104 is not limited to this and may slidingly move the first door 468-1 and the second door 468-2 along the circumferential direction of the side wall 461 of the cover member 460 as illustrated in FIG. 7A. Further, the opening step 104 may slidingly move the first door 468-1 and the second door 468-2 in the vertical direction along the side wall 461 of the cover member 460 as illustrated in FIG. 7B.

Subsequently, in the substrate cleaning method, the substrate cleaning nozzles 472a are aimed toward the surface to be plated Wf-a of the substrate Wf (Step 106). In the substrate cleaning method, the sealing cleaning nozzle 472b is aimed toward the sealing member 494-2 (Step 107). While Step 106 and Step 107 have been described as different steps for convenience, Step 106 and Step 107 are executed using the driving mechanism 476 by a first moving step in which the cleaning device 470 (the substrate cleaning member 472 and the contact cleaning member 482) is moved to the cleaning position through the opening 461a opened by the opening step 104.

Subsequently, in the substrate cleaning method, the substrate holder 440 (and the substrate Wf) is inclined using the inclination mechanism 447 (inclination step 108). Subsequently, in the substrate cleaning method, the substrate holder 440 (and the substrate Wf) is rotated using the rotation mechanism 446 (rotation step 110). The execution order of the opening step 104, the inclination step 108, and the rotation step 110 may be switched, or the opening step 104, the inclination step 108, and the rotation step 110 may be executed simultaneously.

Subsequently, in the substrate cleaning method, the cleaning liquid is discharged to the surface to be plated Wf-a of the substrate Wf rotated by the rotation step 110 from the position Lo corresponding to the lower end of the substrate Wf inclined by the inclination step 108 toward the position Hi corresponding to the upper end (substrate cleaning step 112). The plating solution accumulating on the surface to be plated Wf-a is cleaned by the substrate cleaning step 112. The substrate cleaning step 112 can also discharge the cleaning liquid having a speed component in an opposite direction to the rotation direction of a rotated substrate. In this case, since the substrate Wf may be held horizontally, the inclination step 108 need not be executed.

In the substrate cleaning method, the cleaning liquid having a speed component in the direction along the rotation direction of the sealing member 494-2 rotated by the rotation step 110 is discharged toward the inner circumference surface of the sealing member 494-2 from the sealing cleaning nozzle 472b (sealing cleaning step 113). The plating solution accumulating on the inner circumference surface of the sealing member 494-2 is cleaned by the sealing cleaning step 113. While the substrate cleaning step 112 and the sealing cleaning step 113 have been described as different steps for convenience, both steps may be executed simultaneously.

Subsequently, in the substrate cleaning method, discharge of the cleaning liquid to the surface to be plated Wf-a of the substrate Wf is stopped based on the electrical conductivity of the cleaning liquid measured by the electrical conductivity meter 486 (stopping step 114). That is, the plating solution accumulating on the surface to be plated Wf-a of the substrate Wf is swept away by the cleaning liquid, drops in the tray member 478, and is discharged through the fixed tray member 484. Here, the electrical conductivity of the cleaning liquid is measured by the electrical conductivity meter 486. When the measured electrical conductivity becomes sufficiently lower, it turns out that the amount of the plating solution included in the cleaning liquid is sufficiently reduced, that is, that the cleaning process is completed. Therefore, the substrate cleaning method can end the substrate cleaning.

Subsequently, in the contact cleaning method, the substrate holder 440 (and the substrate) inclined by the inclination step 108 is returned to a state before inclination, that is, a horizontal state (inclination releasing step 116). Subsequently, in the contact cleaning method, rotation of the substrate holder 440 rotated by the rotation step 110 is stopped (rotation stopping step 118). The execution order of the inclination releasing step 116 and the rotation stopping step 118 may be switched, or the inclination releasing step 116 and the rotation stopping step 118 may be executed simultaneously.

Subsequently, in the contact cleaning method, the back plate assembly 492 is moved up to grip the substrate Wf from the substrate holder 440 (substrate gripping step 120). Subsequently, in the contact cleaning method, the contact cleaning nozzle 482a is aimed toward the contact member 494-4 attached to the substrate holder 440 (Step 121). While it has been described that the contact cleaning nozzle 482a is aimed toward the contact member 494-4 in Step 121 for convenience, Step 121 is executed by the above-described first moving step.

Subsequently, in the contact cleaning method, the back plate assembly 492 is moved down and arranged at the position surrounded by the contact member 494-4 (arrangement step 122). Subsequently, in the contact cleaning method, the substrate holder 440 (and the substrate Wf) is inclined using the inclination mechanism 447 (inclination step 124). Subsequently, in the contact cleaning method, the substrate holder 440 (and the substrate Wf) is rotated using the rotation mechanism 446 (rotation step 126). The execution order of the arrangement step 122, the inclination step 124, and the rotation step 126 may be switched, or the arrangement step 122, the inclination step 124, and the rotation step 126 may be executed simultaneously.

Subsequently, in the contact cleaning method, the cleaning liquid is discharged toward the main body 494-4*b* of the contact member 494-4 from the contact cleaning member 482 arranged below the substrate holder 440 (contact cleaning step 128). The contact cleaning step 128 is executed toward the contact member 494-4 attached to the substrate holder 440 that is inclined by the inclination step 124 and located at a relatively low position. Specifically, as illustrated in FIG. 20, the contact cleaning step 128 can discharge the cleaning liquid toward the lower surface of the back plate assembly 492 and aim the cleaning liquid that has bounced after hitting against the lower surface of the back plate assembly 492 toward the main body 494-4*b*. However, the contact cleaning step 128 is not limited to this and may discharge the cleaning liquid directly to the main body 494-4*b* from the contact cleaning nozzle 482*a*. The plating solution accumulating on the contact member 494-4 is cleaned by the contact cleaning step 128.

Subsequently, in the contact cleaning method, when the electrical conductivity of the cleaning liquid measured by the electrical conductivity meter 486 becomes smaller than a predetermined threshold, the substrate holder 440 (and the substrate) inclined by the inclination step 124 is returned to the state before the inclination, that is, the horizontal state (inclination releasing step 130). Subsequently, in the contact cleaning method, the cleaning liquid is discharged toward the main body 494-4*b* of the contact member 494-4 of the substrate holder 440 horizontalized by the inclination releasing step 130 (wet step 132). The wet step 132 is a step for not causing power feeding variation during the subsequent plating process by uniformly wetting the entire contact member 494-4 with the cleaning liquid (pure water).

After the cleaning of the substrate Wf and the cleaning of the contact member 494-4 end, in the substrate cleaning method, the cleaning device 470 (the substrate cleaning member 472 and the contact cleaning member 482) is moved to the retracted position (second moving step 134). Subsequently, in the substrate cleaning method, the first door 468-1 and the second door 468-2 are moved to the opening 461*a* of the side wall 461 of the cover member 460 to close the opening 461*a* (closing step 136).

Several embodiments of the present invention have been described above, but the above embodiments of the invention are to facilitate understanding of the present invention and do not limit the present invention. Needless to say, the present invention may be changed or modified within the gist of the present invention, and the present invention includes equivalents. Furthermore, in a range in which at least a part of the above-described problem can be solved or in a range in which at least a part of an effect is produced, any components described in claims and description can be combined or omitted.

This application discloses a plating apparatus as one embodiment. The plating apparatus includes: a plating tank configured to accommodate a plating solution; a substrate holder configured to hold a substrate with a surface to be plated facing downward; a rotation mechanism configured to rotate the substrate holder; an inclination mechanism configured to incline the substrate holder; and a substrate cleaning member for cleaning the surface to be plated of the substrate held by the substrate holder. The substrate cleaning member is configured to discharge a cleaning liquid to the surface to be plated of the substrate rotated by the rotation mechanism from a position corresponding to a lower end toward a position corresponding to an upper end of the substrate inclined by the inclination mechanism.

Furthermore, this application discloses, as one embodiment, the plating apparatus that further includes a driving mechanism configured to move the substrate cleaning member between a cleaning position and a retracted position, the cleaning position is between the plating tank and the substrate holder, and the retracted position is retracted from between the plating tank and the substrate holder.

Furthermore, this application discloses, as one embodiment, the plating apparatus that further includes a tray member arranged below the substrate cleaning member and configured to receive the cleaning liquid that has dropped after being discharged from the substrate cleaning member.

Furthermore, this application discloses, as one embodiment, the plating apparatus that further includes an electrical conductivity meter for measuring an electrical conductivity of the cleaning liquid that has dropped in the tray member.

Furthermore, this application discloses, as one embodiment, the plating apparatus in which the substrate cleaning member includes a plurality of substrate cleaning nozzles arranged along a direction intersecting with a rotation direction of the substrate when the substrate cleaning member is arranged at the cleaning position.

Furthermore, this application discloses, as one embodiment, the plating apparatus in which the substrate holder includes a sealing member for sealing between the substrate holder and the substrate, the substrate cleaning member further includes a sealing cleaning nozzle arranged on an outer peripheral side of the substrate with respect to the plurality of substrate cleaning nozzles to clean the sealing member, and the sealing cleaning nozzle is configured to discharge the cleaning liquid having a speed component in a direction along a rotation direction of the sealing member rotated by the rotation mechanism.

Furthermore, this application discloses, as one embodiment, the plating apparatus in which each of the plurality of substrate cleaning nozzles is configured to discharge the cleaning liquid in a fan shape from a tip of the substrate cleaning nozzle, and is configured such that the cleaning liquids discharged from a neighboring substrate cleaning nozzle does not collide with one another and partially overlap with one another in the rotation direction of the substrate.

Furthermore, this application discloses, as one embodiment, the plating apparatus in which the rotation mechanism is configured to rotate the substrate holder at a rotation speed of 1 rpm to 20 rpm.

Furthermore, this application discloses a substrate cleaning method as one embodiment. The substrate cleaning method includes: a step of aiming a substrate cleaning nozzle toward a surface to be plated facing downward of a substrate held by a substrate holder; an inclination step of inclining the substrate holder; a rotation step of rotating the substrate holder; and a substrate cleaning step of discharging a cleaning liquid from the substrate cleaning nozzle to the surface to be plated of the substrate rotated by the rotation step from a position corresponding to a lower end toward a position corresponding to an upper end of the substrate inclined by the inclination step.

Furthermore, this application discloses, as one embodiment, the substrate cleaning method that further includes: a step of aiming a sealing cleaning nozzle toward a sealing member for sealing between the substrate holder and the substrate; and a sealing cleaning step of discharging the cleaning liquid from the sealing cleaning nozzle, the cleaning liquid has a speed component in a direction along a rotation direction of the sealing member rotated by the rotation step.

Furthermore, this application discloses a plating apparatus as one embodiment. The plating apparatus includes: a plating tank configured to accommodate a plating solution; a substrate holder configured to hold a substrate with a surface to be plated facing downward; a rotation mechanism configured to rotate the substrate holder; and a substrate cleaning member for cleaning the surface to be plated of the substrate held by the substrate holder. The substrate cleaning member is configured to discharge a cleaning liquid having a speed component in an opposite direction to a rotation direction of the substrate rotated by the rotation mechanism.

REFERENCE SIGNS LIST

400 . . . plating module
410 . . . plating tank
440 . . . substrate holder
442 . . . elevating mechanism
446 . . . rotation mechanism
447 . . . inclination mechanism
460 . . . cover member
461 . . . side wall
461a . . . opening
462 . . . bottom wall
464 . . . exhaust outlet
467 . . . opening/closing mechanism
468-1 . . . first door
468-2 . . . second door
469-1 . . . first door driving member
469-2 . . . second door driving member
470 . . . cleaning device
472 . . . substrate cleaning member
472a . . . substrate cleaning nozzle
472b . . . sealing cleaning nozzle
476 . . . driving mechanism
478 . . . tray member
482 . . . contact cleaning member
482a . . . contact cleaning nozzle
486 . . . electrical conductivity meter
488 . . . drain pipe
491 . . . rotation shaft
492 . . . back plate assembly
492-1 . . . back plate
492-2 . . . floating plate
494 . . . supporting mechanism
494-1 . . . supporting member
494-2 . . . sealing member
494-4 . . . contact member
494-4a . . . substrate contact point
494-4b . . . main body 1000 . . . plating apparatus
Wf . . . substrate
Wf-a . . . surface to be plated

The invention claimed is:

1. A plating apparatus comprising:
a plating tank configured to accommodate a plating solution;
a substrate holder configured to hold a substrate with a surface to be plated facing downward, wherein the substrate holder includes a sealing member for sealing between the substrate holder and the substrate;
a rotation mechanism configured to rotate the substrate holder;
an inclination mechanism configured to incline the substrate holder;
a substrate cleaning member for cleaning the surface to be plated of the substrate held by the substrate holder, wherein
the substrate cleaning member includes a plurality of substrate cleaning nozzles arranged along a direction intersecting with a rotation direction of the substrate when the substrate cleaning member is arranged at a cleaning position,
wherein the substrate cleaning member further includes a sealing cleaning nozzle arranged on an outer peripheral side of the substrate with respect to the plurality of the substrate cleaning nozzles to clean the sealing member, and
the sealing nozzle is configured to discharge a cleaning liquid toward the sealing member, in a direction along a rotation direction of the sealing member rotated by the rotation mechanism; and
a control module for controlling operation of the rotation mechanism, the inclination mechanism, and the substrate cleaning member, wherein
the control module is configured to operate the substrate cleaning member to discharge the cleaning liquid to the surface to be plated of the substrate rotated by the rotation mechanism from a position corresponding to a lower end toward a position corresponding to an upper end of the substrate inclined by the inclination mechanism, the substrate cleaning member is arranged to be opposed to the face of the substrate and positioned to discharge cleaning liquid upwardly onto a region of the inclined, rotating substrate that moves upward due to rotation.

2. The plating apparatus according to claim 1, further comprising a driving mechanism configured to move the substrate cleaning member between the cleaning position and a retracted position, the cleaning position being between the plating tank and the substrate holder, the retracted position being retracted from between the plating tank and the substrate holder.

3. The plating apparatus according to claim 1, further comprising
a tray member arranged below the substrate cleaning member and configured to receive the cleaning liquid that has dropped after being discharged from the substrate cleaning member.

4. The plating apparatus according to claim 3, further comprising
an electrical conductivity meter for measuring an electrical conductivity of the cleaning liquid that has dropped in the tray member.

5. The plating apparatus according to claim 1, wherein each of the plurality of substrate cleaning nozzles is configured to discharge the cleaning liquid in a fan shape from a tip of the substrate cleaning nozzle, and is configured such that the cleaning liquids discharged from a neighboring substrate cleaning nozzle does not collide with one another and partially overlap with one another in the rotation direction of the substrate.

6. The plating apparatus according to claim 1, wherein the rotation mechanism is configured to rotate the substrate holder at a rotation speed of 1 rpm to 20 rpm.

7. The plating apparatus according to claim 1, wherein the substrate cleaning member is arranged such that, when viewed from plan view, an angle formed between (i) the flow direction of the plating solution swept away by the cleaning liquid and (ii) a tangent to an edge of the substrate at a point proximate the impingement of the cleaning fluid, in the direction of rotation of the cleaned region of the substrate is greater than 135 degrees and less than 225 degrees.

\*    \*    \*    \*    \*